US011678499B2

(12) United States Patent
Thompson et al.

(10) Patent No.: US 11,678,499 B2
(45) Date of Patent: Jun. 13, 2023

(54) USE OF SINGLET-TRIPLET GAP HOSTS FOR INCREASING STABILITY OF BLUE PHOSPHORESCENT EMISSION

(71) Applicant: Universal Display Corporation, Ewing, NJ (US)

(72) Inventors: Nicholas J. Thompson, Trenton, NJ (US); Jerald Feldman, Wilmington, DE (US); Julia J. Brown, Yardley, PA (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 910 days.

(21) Appl. No.: 16/047,212

(22) Filed: Jul. 27, 2018

(65) Prior Publication Data

US 2019/0036058 A1    Jan. 31, 2019

Related U.S. Application Data

(60) Provisional application No. 62/537,489, filed on Jul. 27, 2017.

(51) Int. Cl.
*H01L 51/50* (2006.01)
*H01L 51/00* (2006.01)
*C09K 11/06* (2006.01)

(52) U.S. Cl.
CPC .......... *H01L 51/5016* (2013.01); *C09K 11/06* (2013.01); *H01L 51/0071* (2013.01); *H01L 51/0072* (2013.01); *H01L 51/0085* (2013.01); *C09K 2211/1029* (2013.01); *C09K 2211/1044* (2013.01); *C09K 2211/1048* (2013.01); *C09K 2211/1059* (2013.01); *C09K 2211/1062* (2013.01); *C09K 2211/1074* (2013.01); *C09K 2211/1077* (2013.01); *C09K 2211/185* (2013.01); *H01L 2251/55* (2013.01)

(58) Field of Classification Search
None
See application file for complete search history.

(56) References Cited

U.S. PATENT DOCUMENTS

| 4,769,292 A | 9/1988 | Tang |
| 5,247,190 A | 9/1993 | Friend |

(Continued)

FOREIGN PATENT DOCUMENTS

| JP | 2006032758 A | * | 2/2006 |
| JP | 2009267244 A | * | 11/2009 |

(Continued)

OTHER PUBLICATIONS

Machine English translation of Takeda et al. (JP 2009-267244 A). May 6, 2021.*

(Continued)

*Primary Examiner* — Jay Yang
(74) *Attorney, Agent, or Firm* — Duane Morris LLP

(57) ABSTRACT

Arrangements for phosphorescent blue emissive materials, layers, and devices are provided. The arrangements include a host having first a triplet energy level of at least 2.8 eV and an absolute difference of not more than 0.3 eV between the first singlet and triplet energy levels, and an emitter that includes an emissive transition metal complex and a first triplet energy level of at least 2.7 eV.

15 Claims, 5 Drawing Sheets

(56) References Cited

U.S. PATENT DOCUMENTS

| | | |
|---|---|---|
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 7,279,704 B2 | 10/2007 | Walters |
| 7,431,968 B1 | 10/2008 | Shtein |
| 7,491,823 B2 | 2/2009 | Thompson |
| 7,534,505 B2 | 5/2009 | Lin |
| 7,968,146 B2 | 6/2011 | Wagner |
| 9,493,698 B2 | 11/2016 | Beers |
| 9,502,656 B2 | 11/2016 | Scott |
| 9,548,462 B2 | 1/2017 | Knowles |
| 9,899,614 B2 | 2/2018 | Li |
| 2003/0230980 A1 | 12/2003 | Forrest |
| 2004/0174116 A1 | 9/2004 | Lu |
| 2015/0243893 A1* | 8/2015 | Joseph ............... H01L 51/5024 257/40 |
| 2017/0022963 A1 | 1/2017 | DeBenedictis |
| 2017/0229663 A1 | 8/2017 | Tsai |
| 2018/0182981 A1 | 6/2018 | Chen |

FOREIGN PATENT DOCUMENTS

| | | | |
|---|---|---|---|
| JP | 2013191804 A | * | 9/2013 |
| WO | 2008057394 A1 | | 5/2008 |
| WO | 2010011390 A2 | | 1/2010 |

OTHER PUBLICATIONS

Machine English translation of Oshiyama et al. (JP 2013-191804 A). May 6, 2021.*
Machine English translation of Igarashi et al. (JP-2006032758-A). Nov. 8, 2022.*
Baldo, "Highly efficient phosphorescent emission from organic electroluminescent devices," Nature, vol. 395, pp. 151-154, 1998.
Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

* cited by examiner

USE OF SINGLET-TRIPLET GAP HOSTS FOR INCREASING STABILITY OF BLUE PHOSPHORESCENT EMISSION

CROSS-REFERENCE TO RELATED APPLICATIONS

This application claims the priority benefit of U.S. Provisional Patent Application Ser. No. 62/537,489, filed Jul. 27, 2017, the entire contents of which are incorporated herein by reference.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative) Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
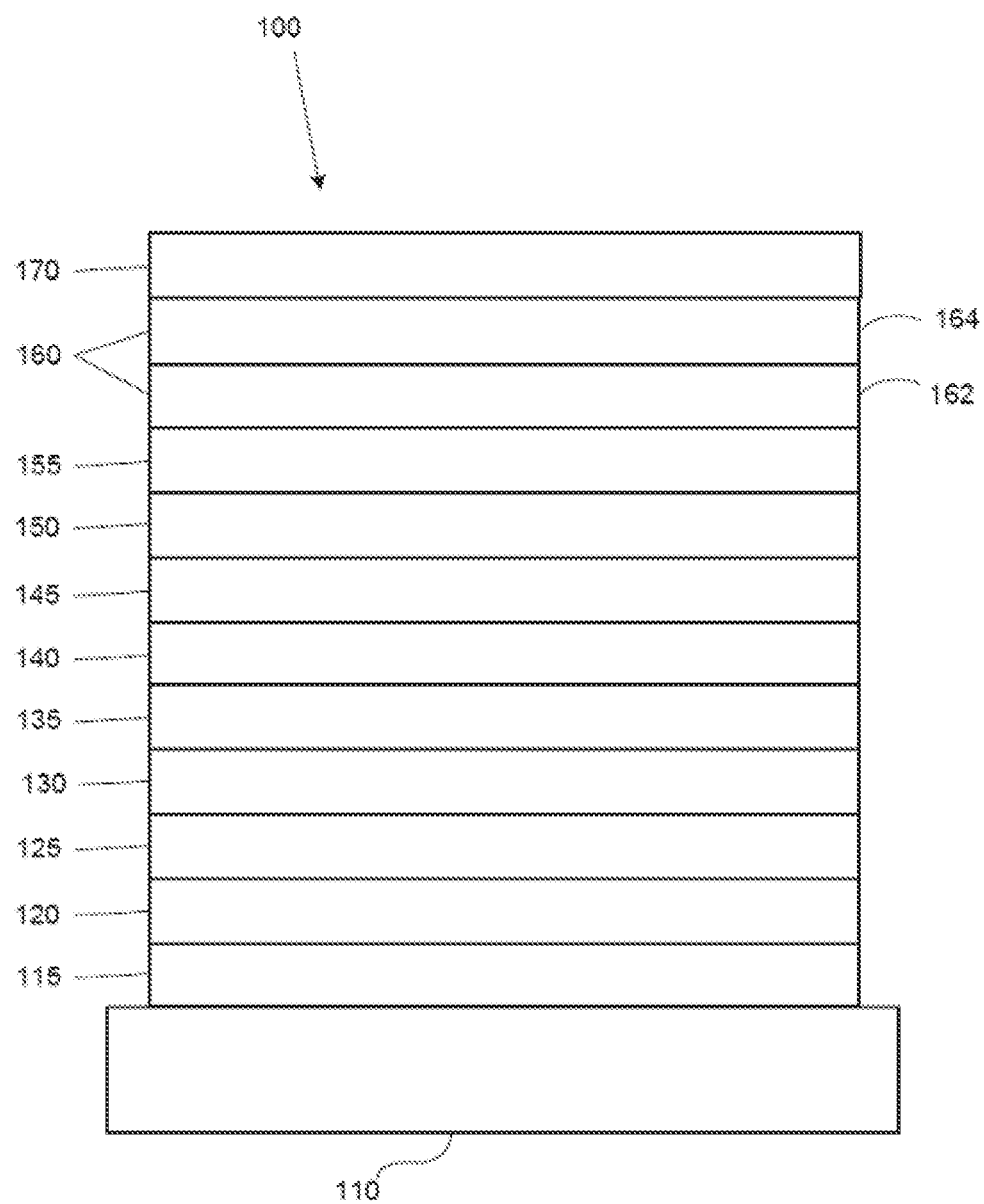
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
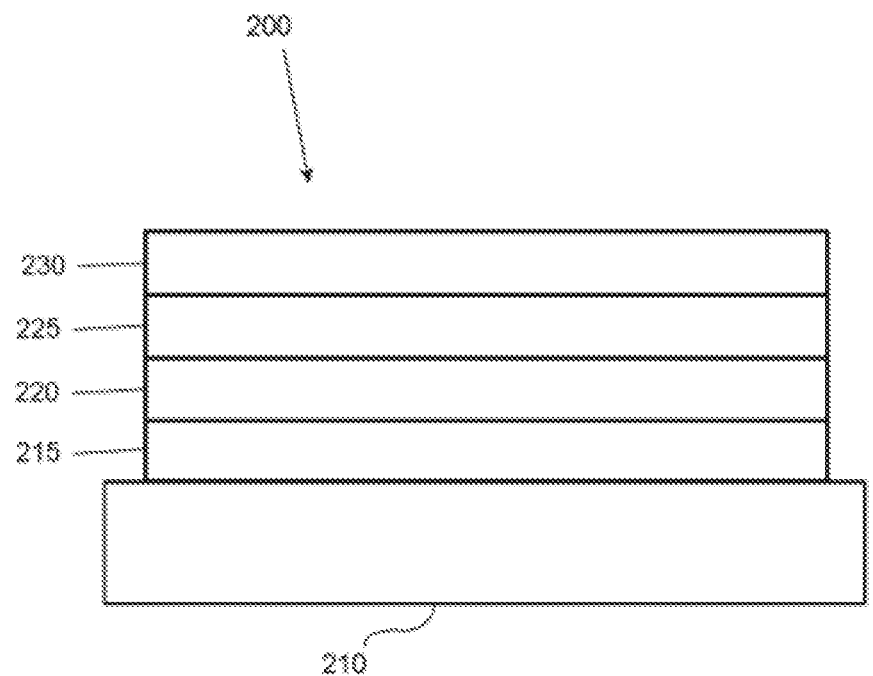
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C. to 30 C., and more preferably at room temperature (20-25 C.), but could be used outside this temperature range, for example, from −40 C. to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Despite recent advances, in many cases blue phosphorescence is still the most challenging target of phosphorescent OLED devices. To achieve commercially viable lifetimes often requires optimization of both the entire OLED device as well as the individual blue emissive layer. Within the emissive layer, the stability of the dopant is typically considered the most important. However, the stability of the host also plays a role in the overall stability of the emissive layer as well as the device. It has also been determined that control of the host molecule in the excited triplet state appears to be especially important for blue OLED devices where the lifetime may be an issue regardless of the emitter methodology for OLED devices; fluorescence, phosphorescence, or thermally activated delayed fluorescence.

For example, typical conventional blue fluorescent OLED devices often include derivatives of anthracene as the host molecule in the blue emissive layer. This is because anthracene can undergo triplet-triplet annihilation (TTA), which results in a single exciton and removal of the triplet state from the host. A benefit of the triplet-triplet annihilation process is that it recycles triplet excitons formed on the fluorescent blue dopant, thereby allowing for the external quantum efficiency (EQE) of the OLED device to exceed 5%. However, there is a secondary benefit of TTA process in that it also reduces the residence time of the triplet exciton on the host molecule. By shortening the amount of time the triplet state resides on the host molecule, the stability of the blue emissive layer as a whole may be increased.

For blue phosphorescent devices, hosts which are derived from anthracene may not be as suitable as in fluorescent devices, because the relatively low triplet energy will quench out the emission from the phosphorescent emitter. Instead, it has been determined that relatively high triplet host molecules where the energy gap between the singlet and triplet is relatively small will act in the same way as anthracene-based hosts do for fluorescent blue emitters. That is, according to embodiments disclosed herein, a host material may be used for a phosphorescent blue emissive layer that has a relatively small gap between the singlet and triplet energy levels. Specifically, host materials having an absolute energy difference of not more than 0.3 eV between the singlet and triplet energy levels may provide such a benefit, and thereby allow for phosphorescent blue emissive layers with improved lifetimes.

Figure 3A:
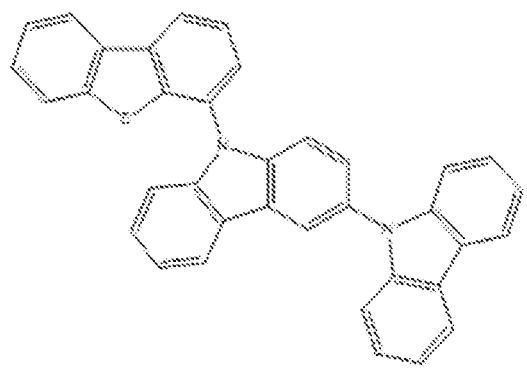
FIGS. 3A, 3B, and 3C show Compounds A, B, and C, respectively, which represent examples of chemical compounds having a sufficiently high triplet energy for use in blue phosphorescent OLEDs according to embodiments disclosed herein, in which modification of a parent molecule results in children molecules that have thermally activated delayed fluorescence (TADF)

As an example, a blue phosphorescent emitter with a first emission peak at 77K that is less than or equal to 480 nm may be placed in a conventional blue host material, such as Compound A shown in FIG. 3A. Such a device would be expected to have reasonable, but conventional, device performance and lifetime. It is known that Compound A has an intrinsic triplet of 416 nm at 77K in frozen glass and should not quench the blue phosphorescent emitter. However, any highly excited triplet excitons on the dopant that are made through triplet-triplet annihilation on the dopant can easily cross into the triplet manifold of the host. This results in a population of triplet excitons residing on the host. Since the triplet exciton is a spin-forbidden state for the host molecule, this triplet will reside for a long period of time on the host before recombining non-radiatively. While the triplet resides on the host, the energy of the triplet exciton may result in destructive chemistry alterations to the molecule and cause the host within the emissive layer can fall apart. After the host falls apart, the resultant pieces may further degrade surrounding molecules, accentuating the loss in emissive layer operational brightness.

Figure 3B:
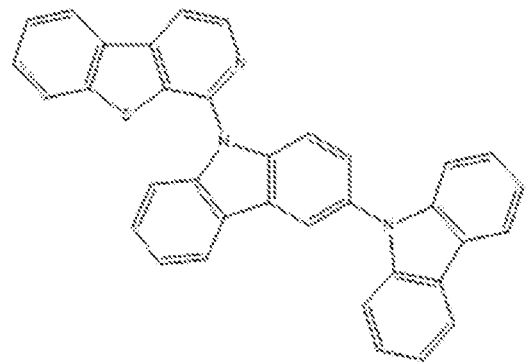

According to an embodiment disclosed herein, Compound B as shown in FIG. 3B may be used in the same arrangement instead of Compound A. Compound B has a relatively small energy difference between the singlet and triplet states. This means that, through thermal activation, the triplet exciton can be converted back to the singlet exciton in a timeframe of as low as 0.1 ms, to a timeframe on the order of hundreds of microseconds. Once converted back to the singlet exciton state, the energy will further decay radiatively or via energy transfer to the phosphorescent dopant. The time for thermal conversion from the triplet to the singlet is orders of magnitude faster than the typical non-radiative decays of triplets when they are spin disallowed states, which are on the order of one millisecond to one second. Since the energy of the triplet on the host molecule is removed more rapidly from the host having a small singlet-triplet energy difference as disclosed herein, it is believed that the intrinsic stability of the host molecule is increased. This in turn increases the stability of the entire device.

In conventional blue phosphorescent OLEDs, the triplet state on the conventional host molecule may be considered to have a reduced residence time on the host because the transfer to the blue phosphorescent emitter it is energetically downhill However, this transfer occurs via Dexter energy transfer, in which the energy transfers to the emitter via a non-radiative path. Dexter energy transfer in general requires a wavefunction overlap between the donor and acceptor molecules, which means in this case it is dependent on the wavefunction overlap between the host and phosphorescent molecules. Dexter energy transfer typically requires relatively short distances, such as 10 Å or less, between the donor and acceptor.

However, for relatively bulky hosts or dopants the triplet wavefunction may be highly shielded by substituent groups. In these cases, Dexter energy transfer will be inefficient and therefore less likely to occur. By decreasing the singlet to triplet energy gap of the host as disclosed herein, thermal energy allows for conversion of the triplet exciton to a singlet exciton. This in turn allows for longer-range Forster energy transfer between the singlet of the host and the singlet of the phosphor which speeds up energy transfer, thereby preventing damage to the host as occurs with Dexter energy transfer.

With a larger transfer radius as is possible in Forster transfers as disclosed herein, for a fixed doping concentration of phosphor the average number of phosphor molecules residing within the transfer radius of the host is increased. With more phosphor molecules to accept the triplet of the host, the transfer probability is also increased. Equivalently, the residence time of the triplet exciton on the host is reduced. As previously noted, this may prevent or reduce damage to the host that otherwise may be expected to occur at higher residence times.

One technique to achieve a relatively low energy difference between the singlet and triplet states of a host molecule is to have donor and acceptor parts of the host molecule that are separated by a distance.

As an example, Compound A is a conventional host molecule for blue phosphorescence that includes carbazole and dibenzothiophene (DBT). With the connections between the carbazole and other moieties in the molecule occurring through the nitrogen group, conjugation does not extend beyond the base moieties. For this reason, the triplet as measured from the 77K spectrum is at 416 nm (2.98 eV) which is the triplet of DBT. The singlet of Compound A can be taken as the high energy edge of the fluorescence, which is 354 nm (3.50 eV). Thus, for Compound A host molecules, the singlet-triplet splitting is 0.52 eV, which is many times kBT at room temperature. Thus, there will be no thermal activation from the triplet state to the singlet state.

Figure 3C:
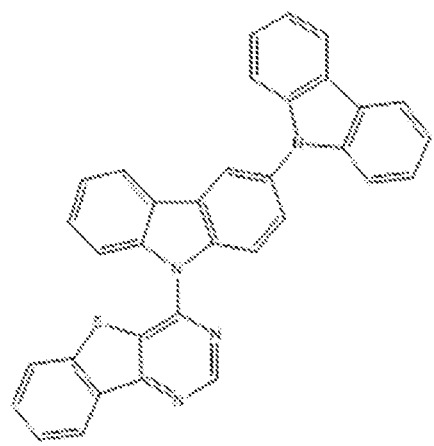
Figure 4A:
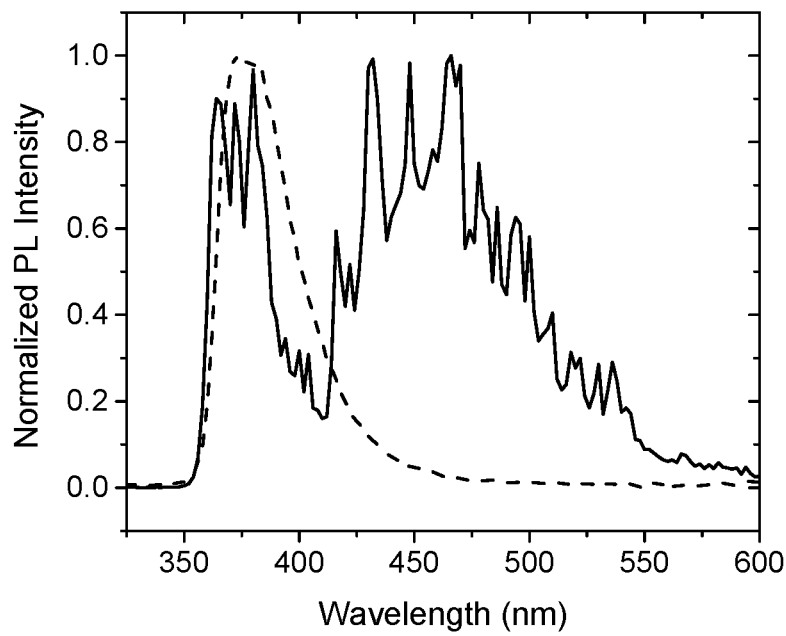
FIGS. 4A, 4B, and 4C show photoluminescence at 77K (solid line) and room temperature (dashed line) for the compounds shown in FIGS. 3A, 3B, and 3C, respectively. Compounds B and C exhibit relatively broad emission at room temperature which indicates that they are thermally activated at room temperature. The emission spectrum of Compound A at 77K includes singlet and triplet emission.
Figure 4B:
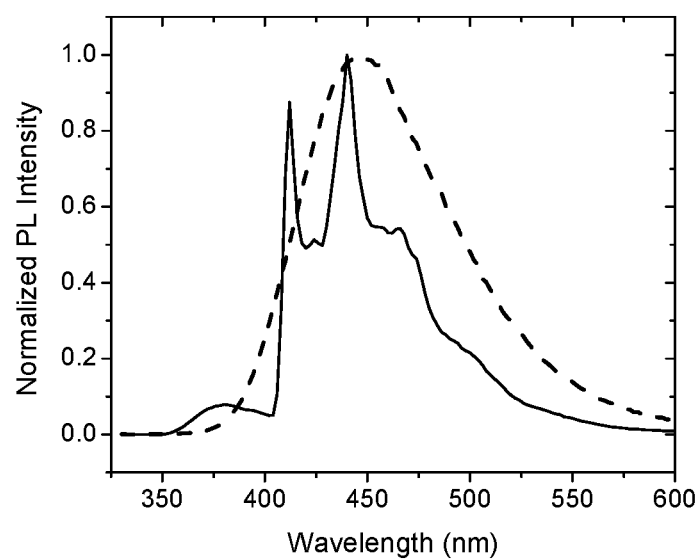
Figure 4C:
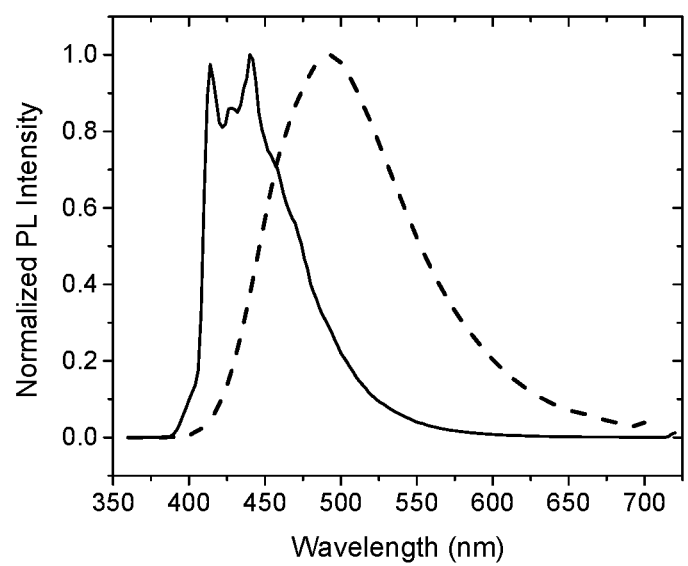

However, the use of aza-dibenzothiophene, shown as Compound B in FIG. 3B and Table I, or di-aza-dibenzothiophene, shown as Compound C in FIG. 3C and Table I, instead of DBT increases the acceptor strength and causes the singlet-triplet energy gap to decrease. These results are shown in FIGS. 4B and 4C, respectively, where the room temperature emission (dashed line) overlaps strongly with the 77K emission (solid line). FIG. 4A shows the equivalent emission for Compound A, in a conventional blue device. The experimental singlet-triplet energy difference is corroborated by DFT calculations as shown in Table I.

TABLE I

| Compound | S1 exp. | T1 exp. | S1 DFT | T1 DFT | S1-T1 exp | D1-T1 DFT |
|---|---|---|---|---|---|---|
| A | 3.50 | 2.98 | 3.67 | 3.13 | 0.53 | 0.54 |
| B | 3.18 | 3.01 | 3.31 | 3.11 | 0.17 | 0.20 |
| C | 3.07 | 3.00 | 3.08 | 2.93 | 0.07 | 0.15 |

(energy levels in eV)

It has been found that the use of relatively high triplet moieties like aza-dibenzothiophene as part of a host that provides a molecule having a small singlet-triplet energy gap increases the lifetime over that of a similar chemical composition host where the singlet-triplet energy gap is larger.

The stabilization of the host molecules may be particularly important for blue phosphorescent OLED devices where the energy of the triplet exciton is greater than 2.55 eV or, more preferably, greater than 2.70 eV, and the stability of phosphorescent devices is more greatly reduced compared to green emitters (~2.33 eV). Thus, it has been determined that, according to embodiments disclosed herein, an ability to tune the stability of the host may provide a unique method for increasing the stability of blue phosphorescent devices. Such a result may be unexpected, since typically one would expect that the stability of the device is more likely to be sensitive to changes to the emissive material instead of the host. Further, although some green hosts may include materials that exhibit TADF, this feature is not used to stabilize any emissive material within the device, nor is the host material itself suitable to do so otherwise. This arrangement also has not been previously used especially with respect to blue emissive materials, as disclosed herein.

As shown by Table I and Compounds B and C, for example, suitable host materials may have various energy level properties. As previously disclosed, in some embodiments the host material may have a triplet energy of at least 2.8 eV. Furthermore, the absolute value of the difference between the triplet and singlet energy levels of the host material may be not more than 0.3 eV. As shown by the examples in Table I, in some embodiments this difference may be not more than 0.2 eV or not more than 0.1 eV.

To enable and/or make more likely the desired energy transitions as previously disclosed, it may be desirable to have specific relationships between the host and emissive material energy levels. For example, in some embodiments the first triplet energy level of the emissive material may be at least 2.70 eV, and the first triplet energy level of the host may be greater than the first triplet energy level of the emissive material.

Furthermore, various emissive materials may be used in combination with any of the host materials previously disclosed. In an embodiment, the emissive material may be an emissive transition metal complex. For example, the emissive material may have the formula $ML_n$, where M is Re, Rh, Ir, Pd, Pt, Os, or Au, and $L_n$ includes n organic ligands which may have at least one direct bond to M. In various embodiments, each L may be the same or different.

In an embodiment, n may be greater than 1 and the emissive transition metal complex may include at least two different ligands. Each ligand of the n ligands may be identical. Alternatively, n may be 3. Where n is 3 or greater, the emissive material may include two ligands that are the same and one that is different from the other two.

In some embodiments, each ligand may be joined with one or more other ligands to form bidentate, tridentate, tetradentate, pentadentate, or hexadentate ligands.

In some embodiments the emitter may have the formula $M(L^1)_x(L^2)_y(L^3)_z$. In some embodiments, $L^1$, $L^2$ and $L^3$ may be the same or different, x may be 1, 2, or 3, y may be 0, 1, or 2, z may be 0, 1, or 2, and/or x+y+z may be the oxidation state of the metal M.

In some embodiments, $L^1$, $L^2$ and $L^3$ are each may be independently selected as

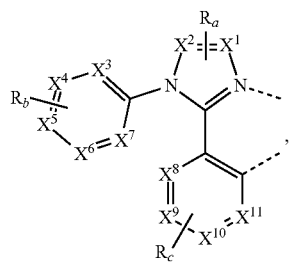

-continued

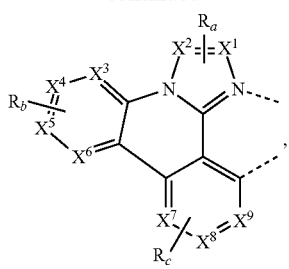

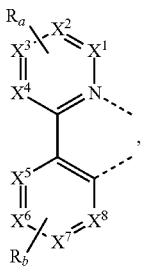

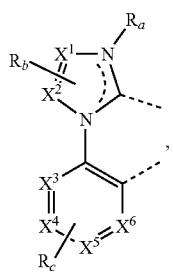

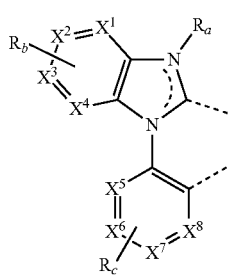

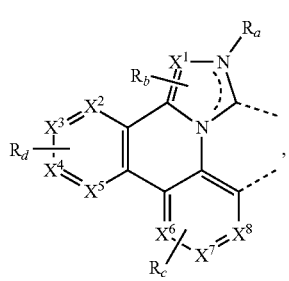

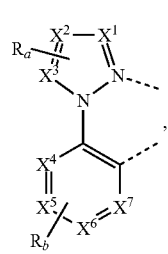

-continued

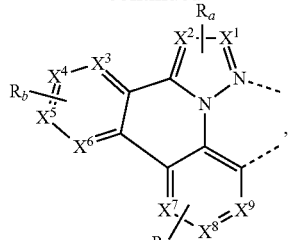

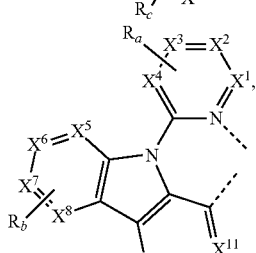

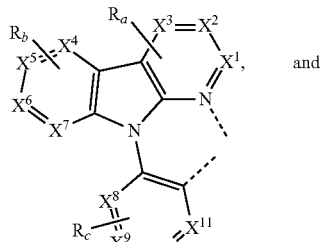

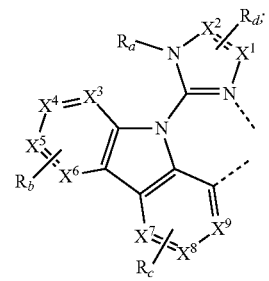

and where each $X^1$ to $X^{11}$ may be independently selected from the group consisting of carbon and nitrogen; X may be selected from the group consisting of BR', NR', PR', O, S, Se, C=O, S=O, SO$_2$, CR'R", SiR'R", and GeR'R"; R' and R" may be optionally fused or joined to form a ring; each $R_a$, $R_b$, $R_c$, and $R_d$ may represent from mono substitution to the possible maximum number of substitution, or no substitution; R', R", $R_a$, $R_b$, $R_c$, and $R_d$ each may be independently selected from the group consisting of hydrogen, deuterium, halogen, alkyl, cycloalkyl, heteroalkyl, heterocycloalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof; and/or any two $R_a$, $R_b$, $R_c$, and $R_d$ may be optionally fused or joined to form a ring or form a multidentate ligand. In some embodiments, R', R", $R_a$, $R_b$, $R_c$, and $R_d$ each may be independently selected as hydrogen, deuterium, fluorine, alkyl, cycloalkyl, alkoxy, aryloxy, amino, silyl, aryl, heteroaryl, sulfanyl, and combinations thereof.

In some embodiments, the compound may have a formula selected from the group consisting of Ir(L$^1$)(L$^2$)(L$^3$), Ir(L$^1$)$_2$(L$^2$), and Ir(L$^1$)$_3$; where L$^1$, L$^2$ and L$^3$ are different and each may be independently selected from the group consisting of:
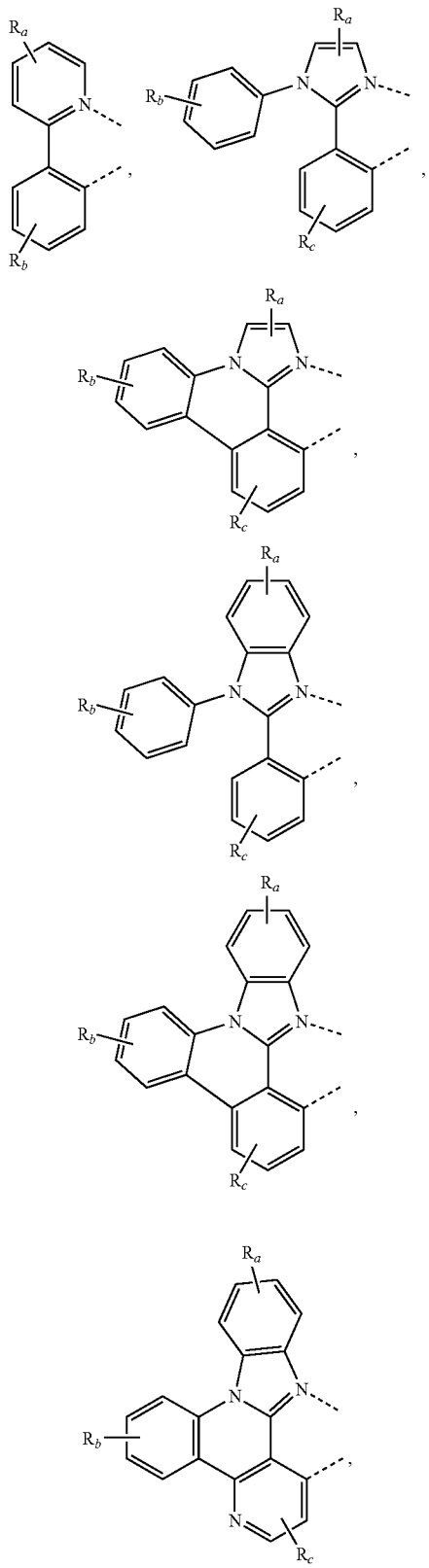
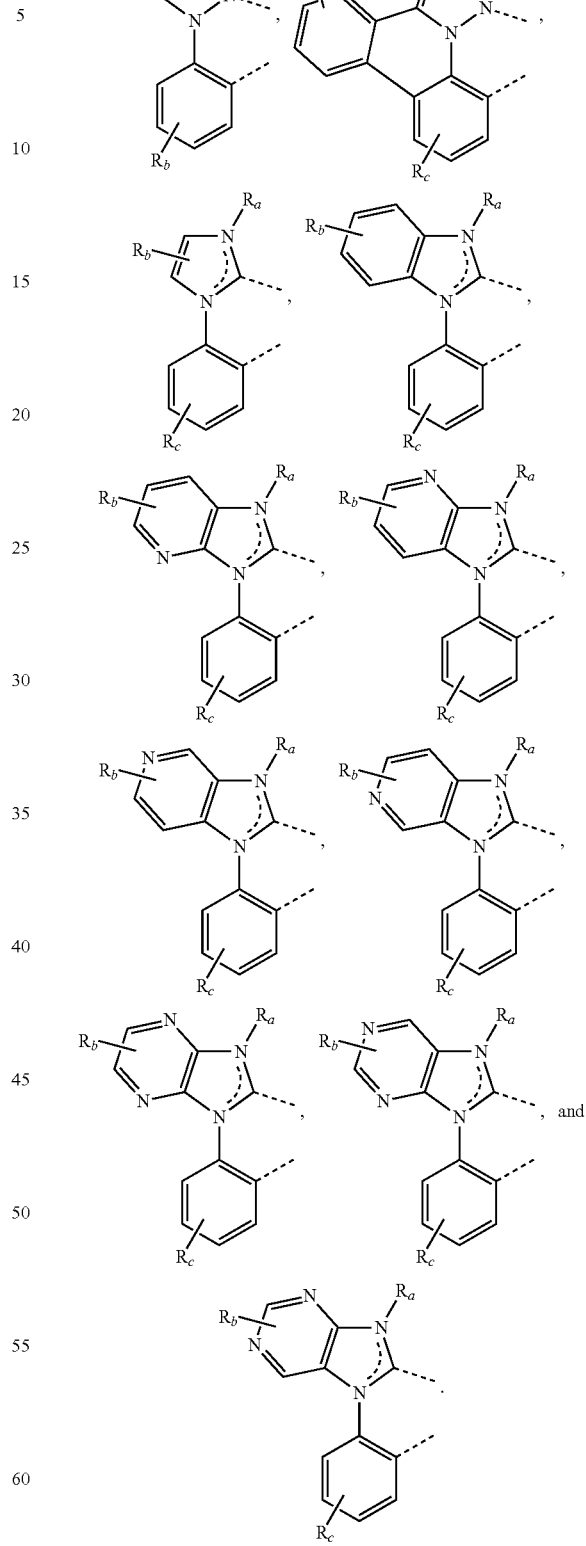
In some embodiments he compound may have the formula of Pt(L$^1$)$_2$ or Pt(L$^1$)(L$^2$). L$^1$ may be connected to the other L$^1$ or L$^2$ to form a tetradentate ligand.

In some embodiments the compound may have the formula of $M(L^1)_2$ or $M(L^1)(L^2)$, where M may be Ir, Rh, Re, Ru, or Os, $L^1$ and $L^2$ each may be a different tridentate ligand.
In some embodiments, $L^1$ may be selected from the group consisting of:
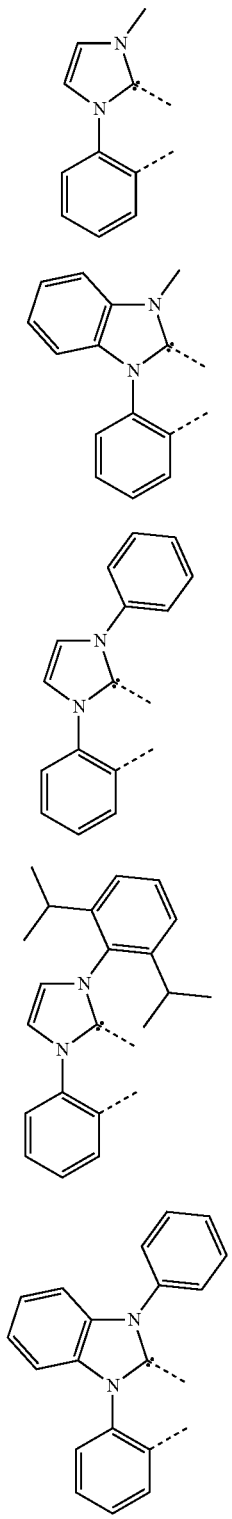
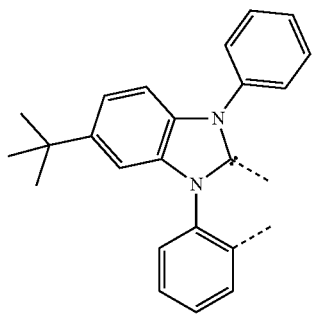
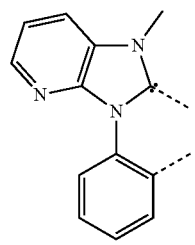
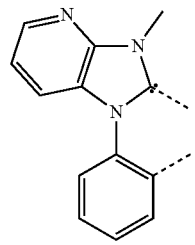
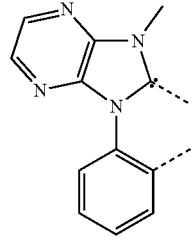
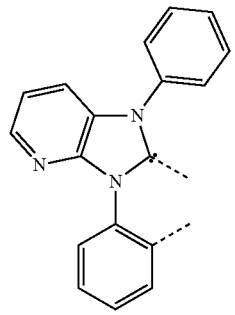

L<sub>B11</sub>
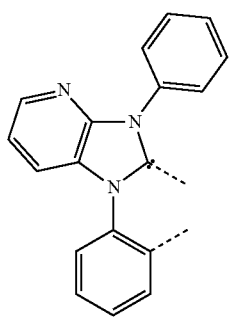
L<sub>B12</sub>
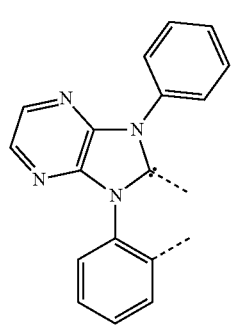
L<sub>B13</sub>
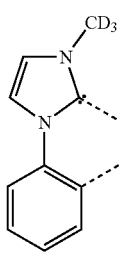
L<sub>B14</sub>
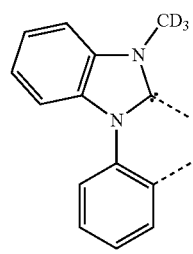
L<sub>B15</sub>
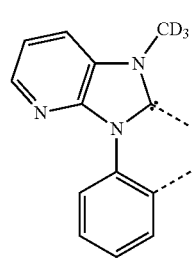
L<sub>B16</sub>
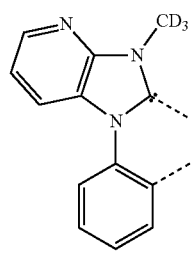
L<sub>B17</sub>
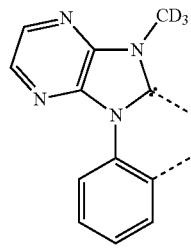
L<sub>B18</sub>
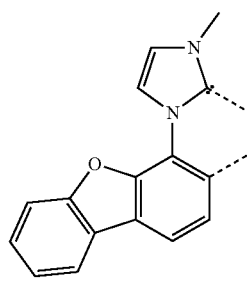
L<sub>B19</sub>
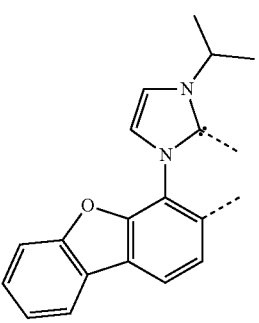
L<sub>B20</sub>
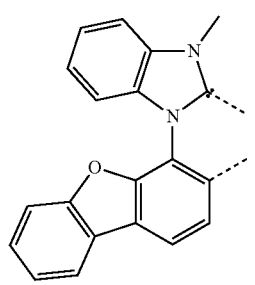

-continued
| | |
|---|---|
| 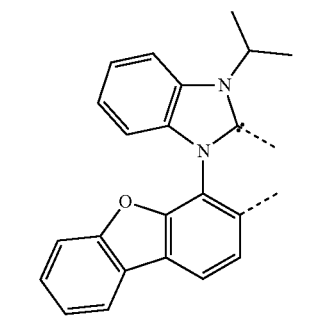 | $L_{B21}$ |
| 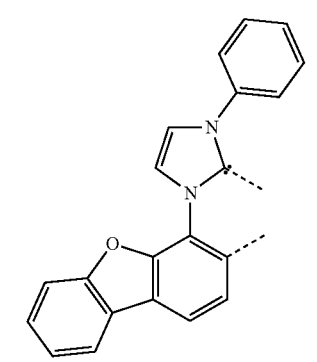 | $L_{B22}$ |
| 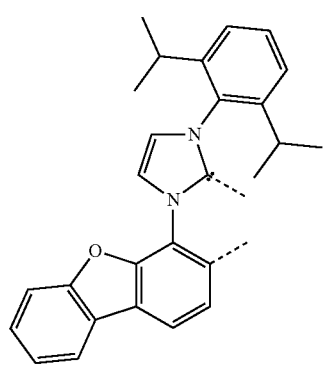 | $L_{B23}$ |
| 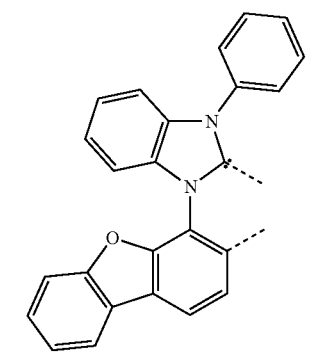 | $L_{B24}$ |
-continued
| | |
|---|---|
| 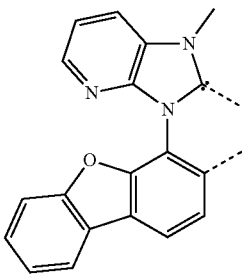 | $L_{B25}$ |
| 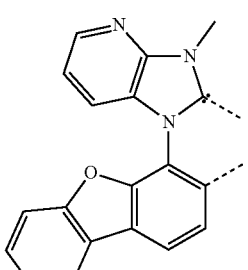 | $L_{B26}$ |
| 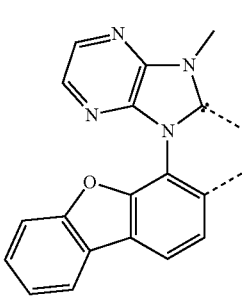 | $L_{B27}$ |
| 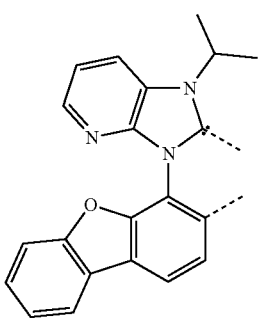 | $L_{B28}$ |
| 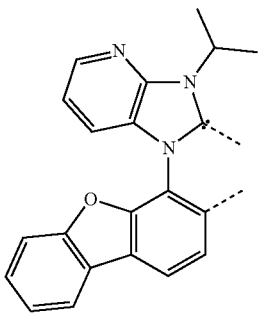 | $L_{B29}$ |

L_{B30}
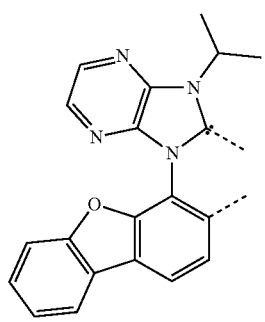
L_{B31}
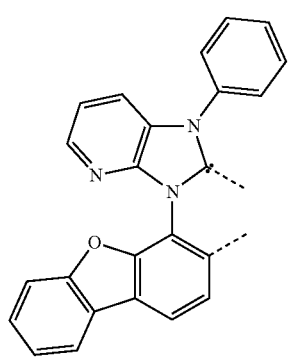
L_{B32}
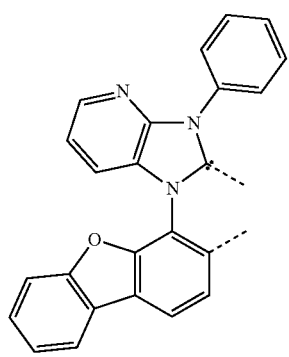
L_{B33}
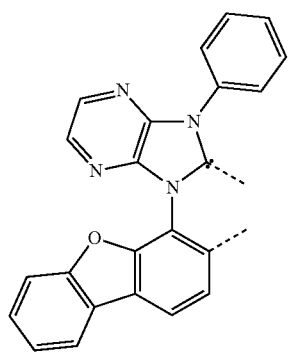
L_{B34}
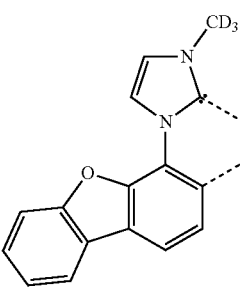
L_{B35}
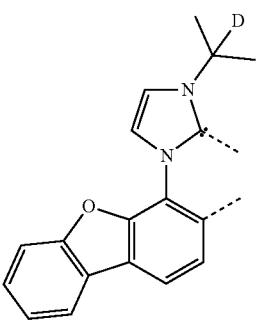
L_{B36}
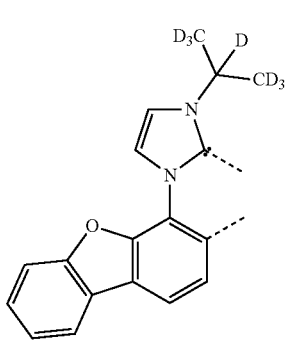
L_{B37}
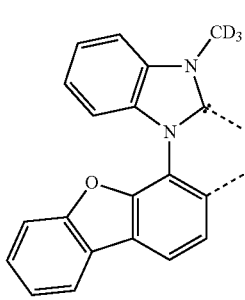
L_{B38}
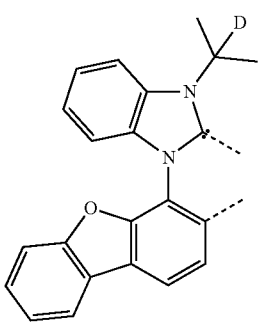

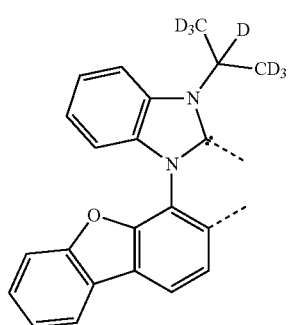 L_{B39}
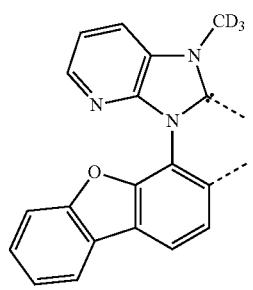 L_{B40}
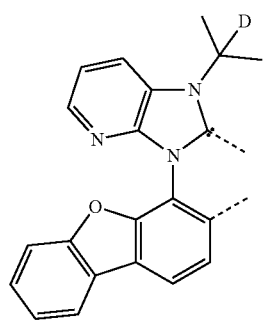 L_{B41}
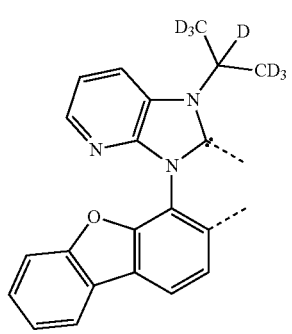 L_{B42}
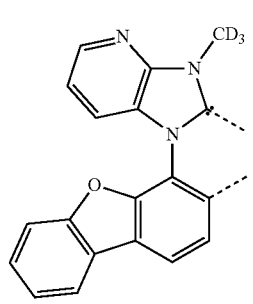 L_{B43}
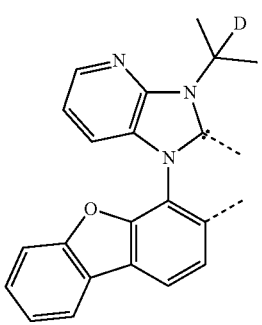 L_{B44}
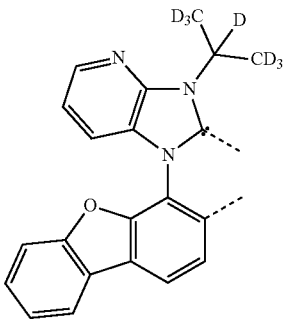 L_{B45}
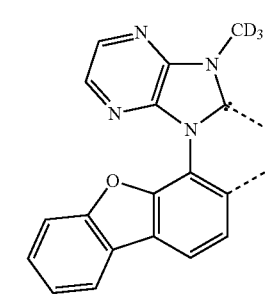 L_{B46}
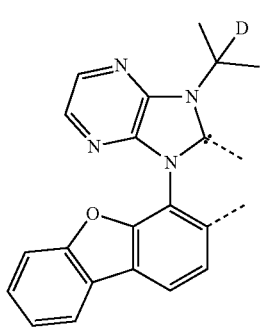 L_{B47}
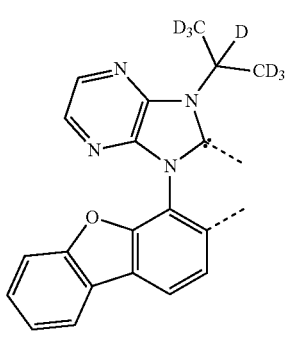 L_{B48}

L*B*49

L*B*50

L*B*51

L*B*52

L*B*53

L*B*54

L*B*55

L*B*56

L*B*57

L*B*58

L_{B59}
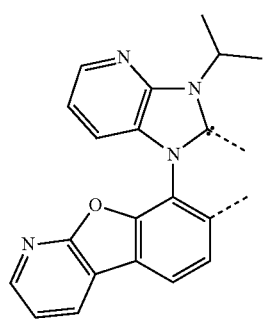
L_{B60}
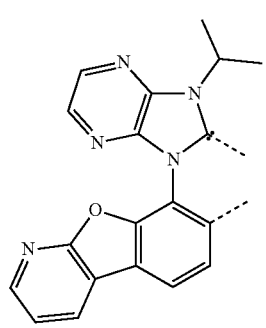
L_{B61}
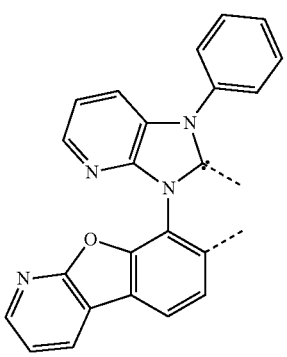
L_{B62}
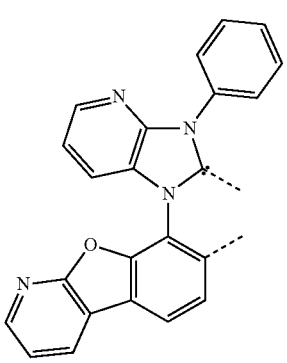
L_{B63}
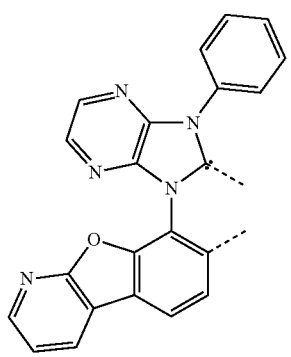
L_{B64}
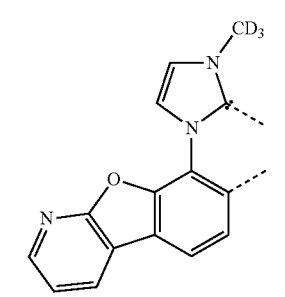
L_{B65}
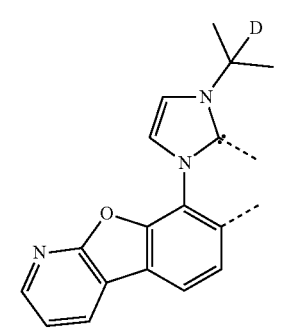
L_{B66}
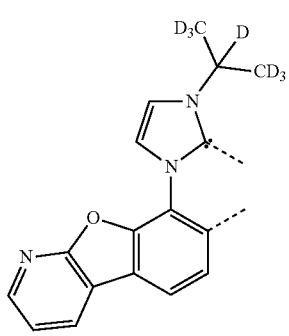
L_{B67}
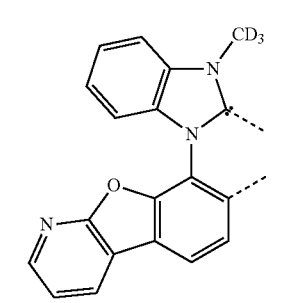

L<sub>B68</sub>
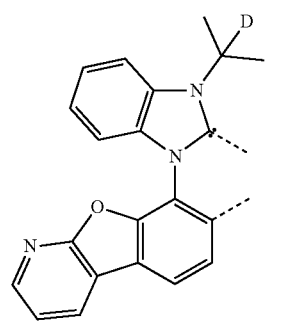
L<sub>B69</sub>
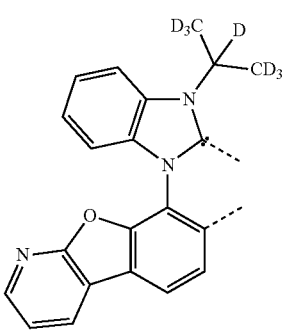
L<sub>B70</sub>
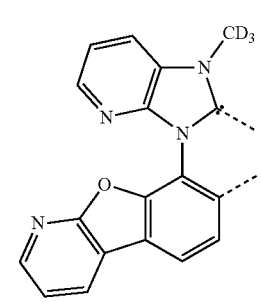
L<sub>B71</sub>
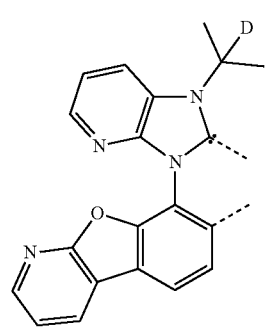
L<sub>B72</sub>
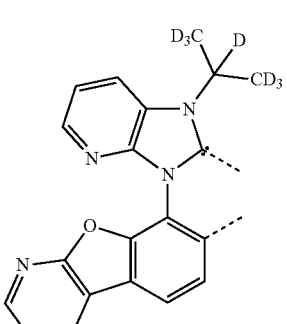
L<sub>B73</sub>
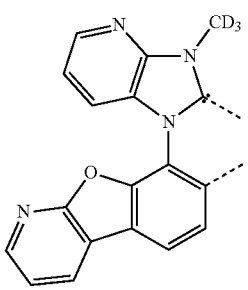
L<sub>B74</sub>
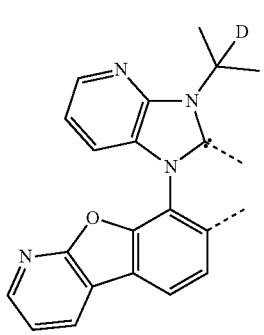
L<sub>B75</sub>
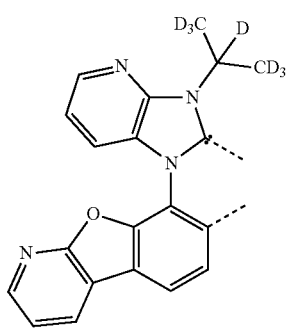
L<sub>B76</sub>
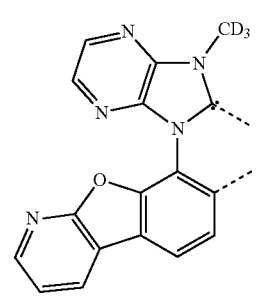
L<sub>B77</sub>
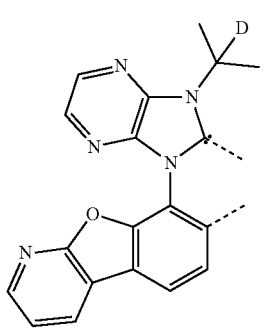

L<sub>B78</sub>
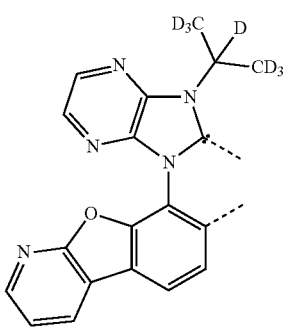
L<sub>B79</sub>
L<sub>B80</sub>
L<sub>B81</sub>
L<sub>B82</sub>
L<sub>B83</sub>
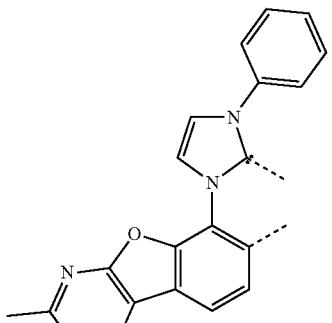
L<sub>B84</sub>
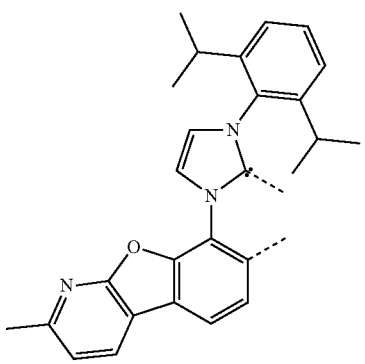
L<sub>B85</sub>
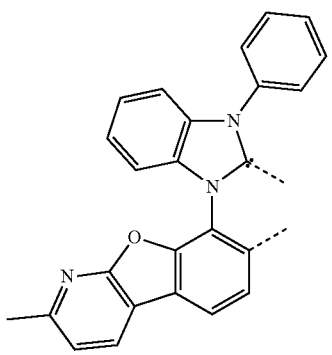
L<sub>B86</sub>
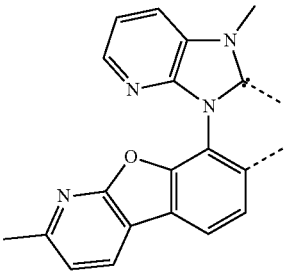
L<sub>B87</sub>
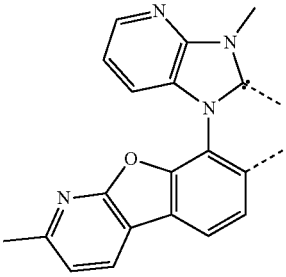

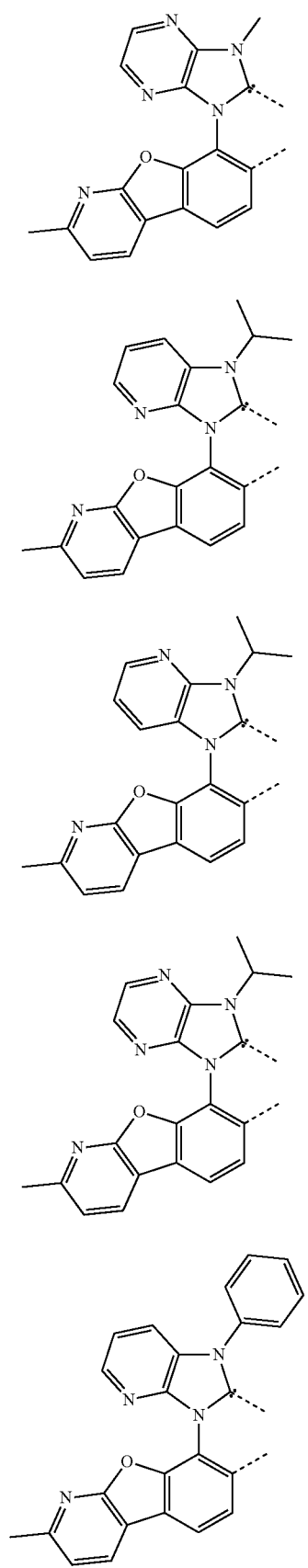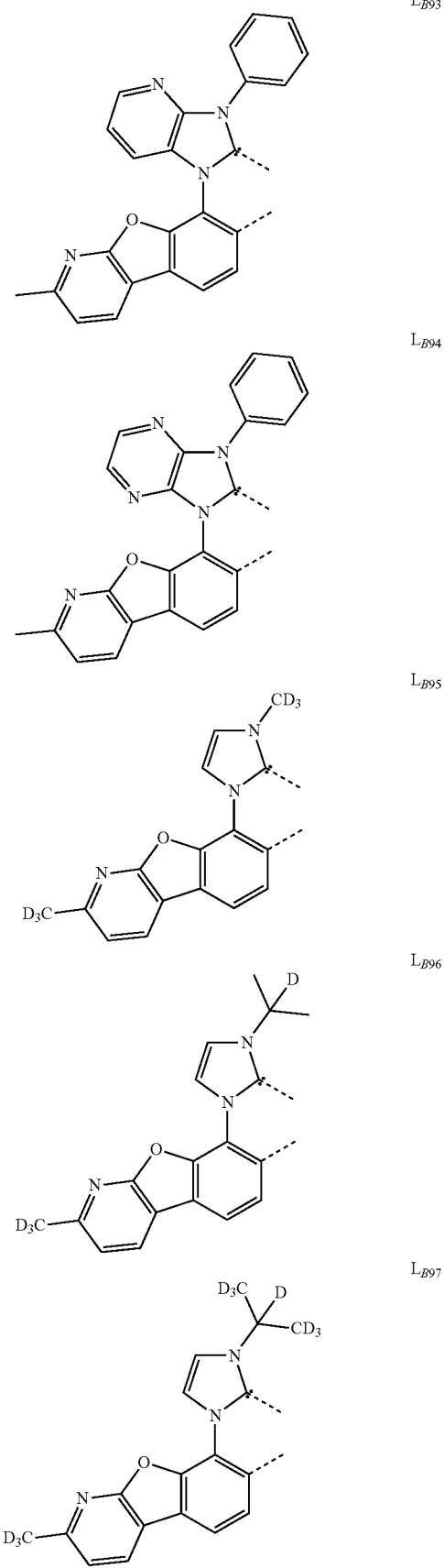

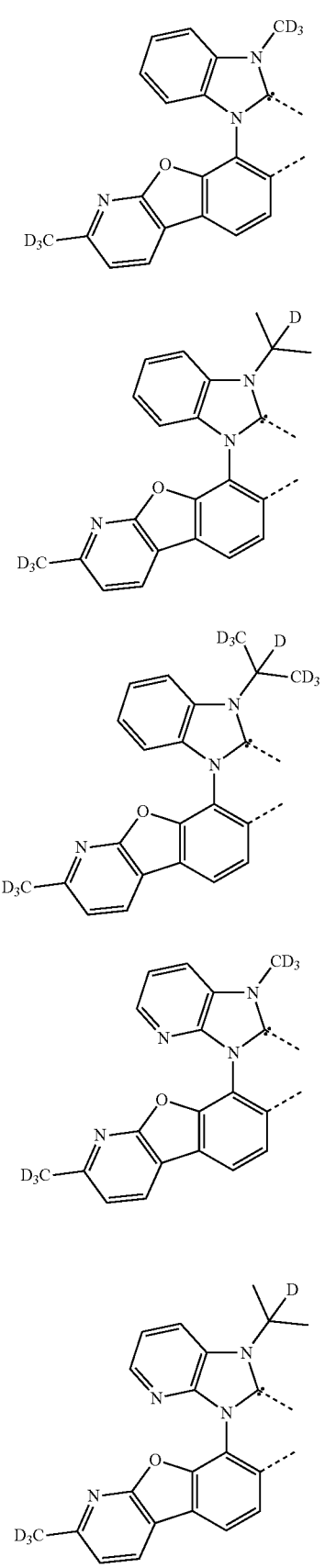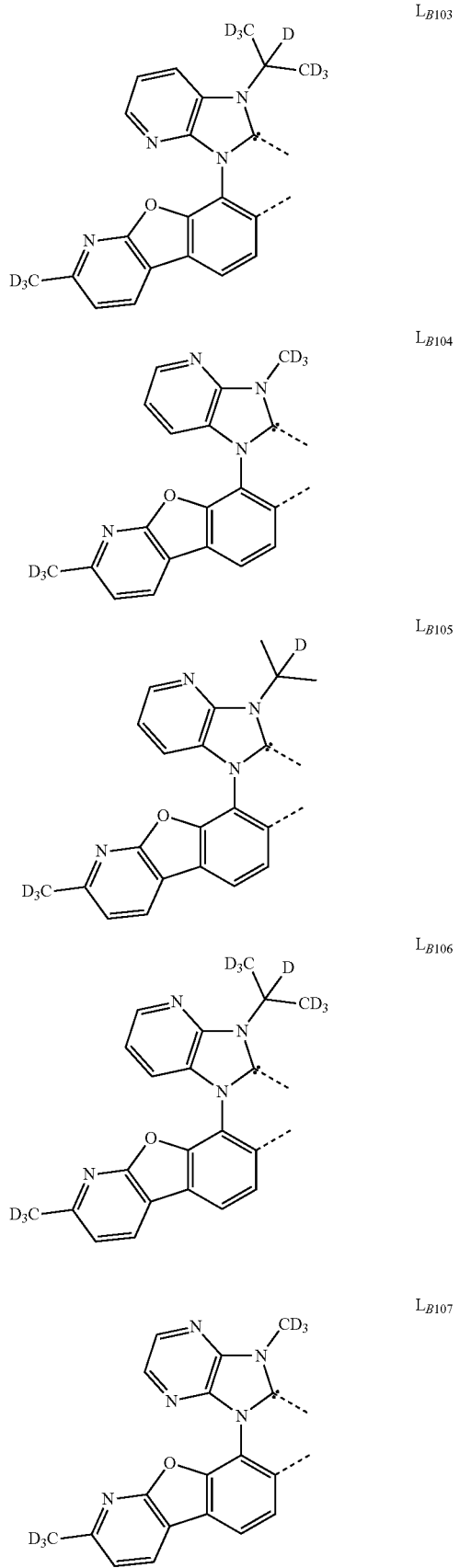

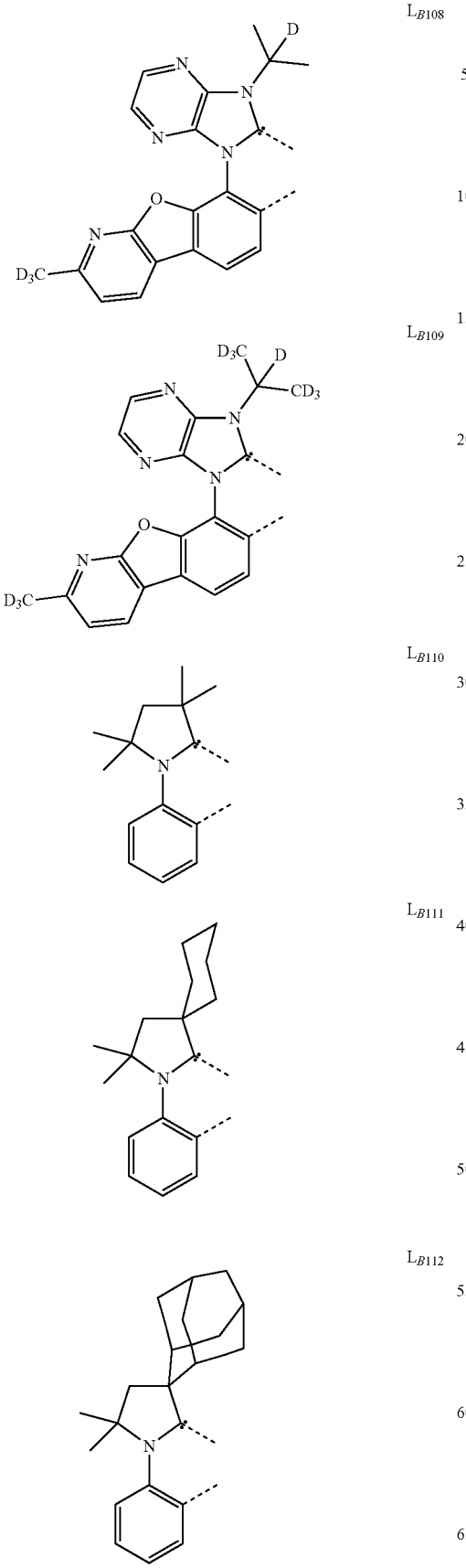
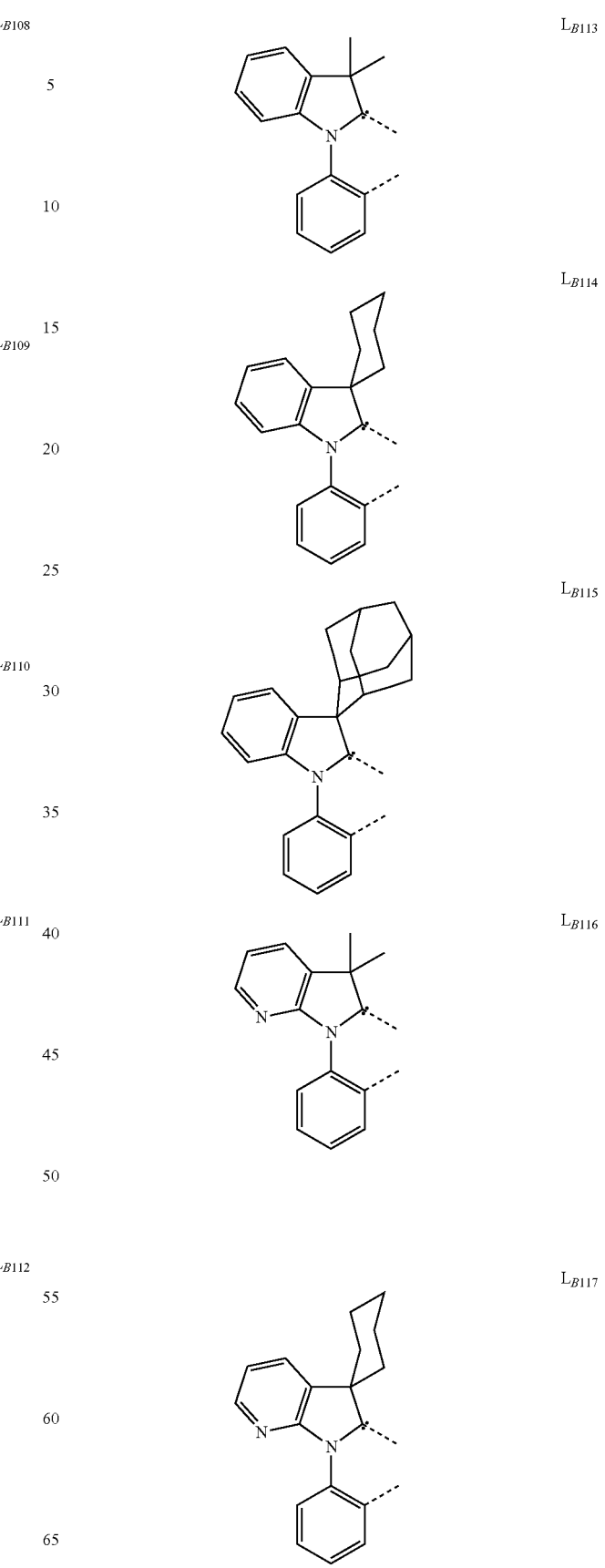

L<sub>B118</sub>
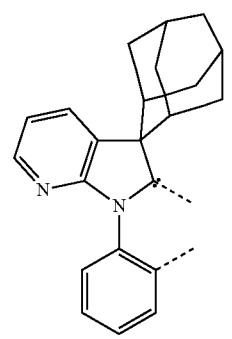
L<sub>B119</sub>
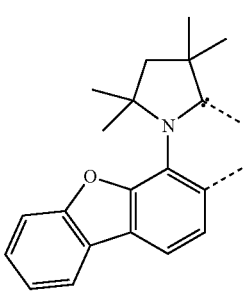
L<sub>B120</sub>
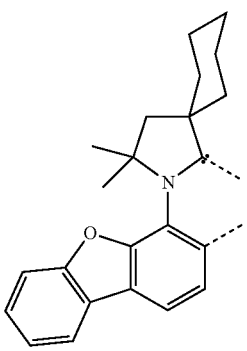
L<sub>B121</sub>
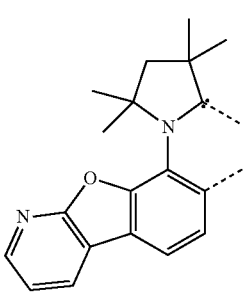
L<sub>B122</sub>
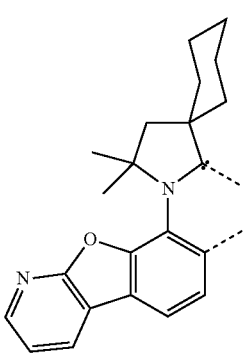
L<sub>B123</sub>
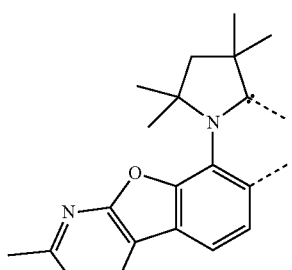
L<sub>B124</sub>
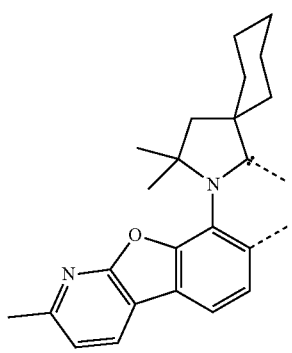
L<sub>B125</sub>
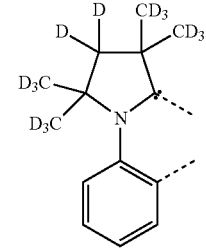
L<sub>B126</sub>
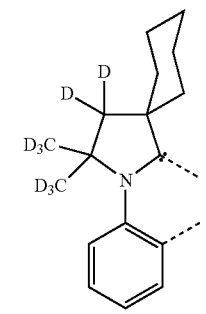
L<sub>B127</sub>
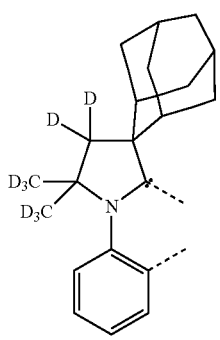

L<sub>B128</sub> 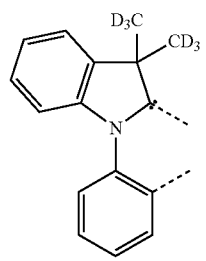
L<sub>B129</sub> 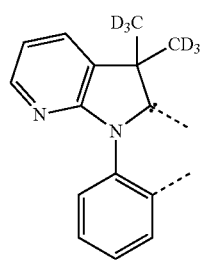
L<sub>B130</sub> 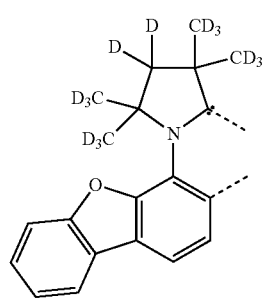
L<sub>B131</sub> 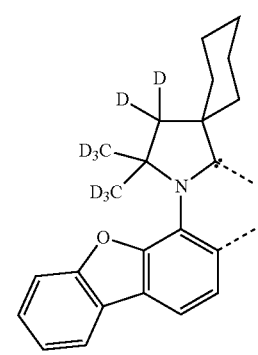
L<sub>B132</sub> 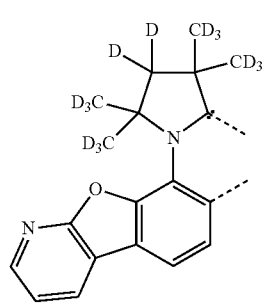
L<sub>B133</sub> 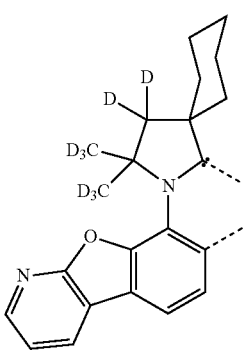
L<sub>B134</sub> 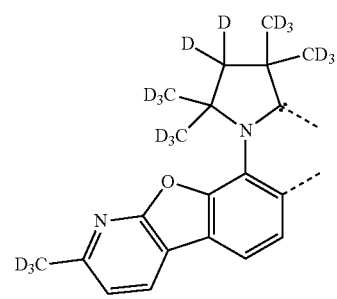
L<sub>B135</sub> 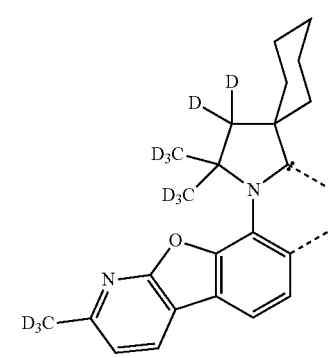
L<sub>B136</sub> 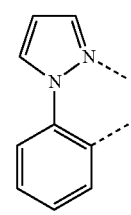
L<sub>B137</sub> 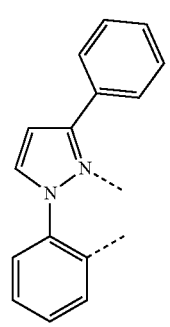

L<sub>B138</sub>
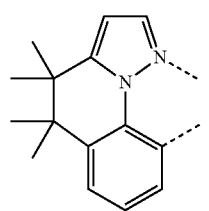
L<sub>B139</sub>
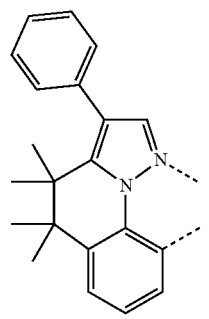
L<sub>B140</sub>
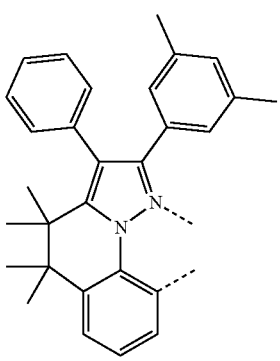
L<sub>B141</sub>
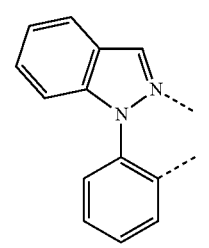
L<sub>B142</sub>
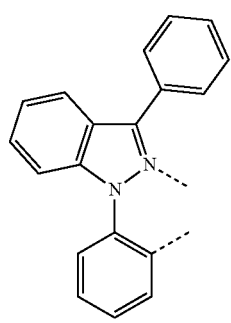
L<sub>B143</sub>
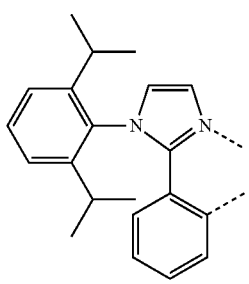
L<sub>B144</sub>
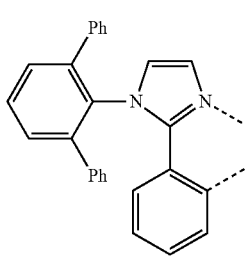
L<sub>B145</sub>
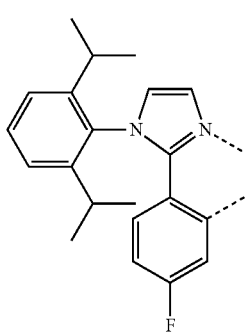
L<sub>B146</sub>
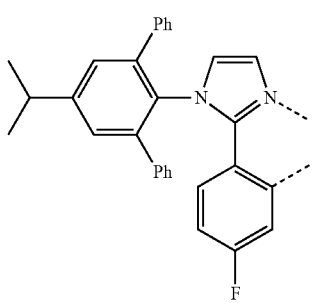
L<sub>B147</sub>
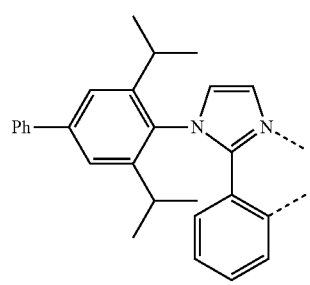

L_{B148}
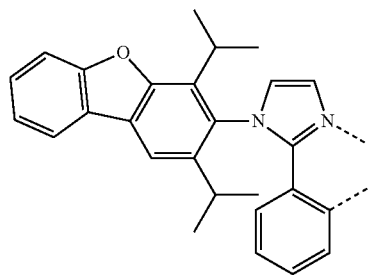
L_{B149}
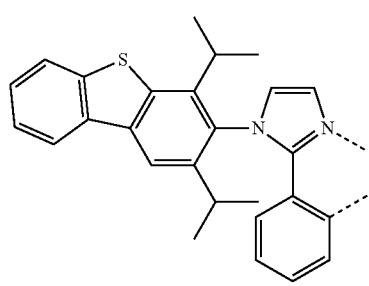
L_{B150}
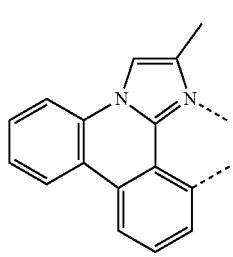
L_{B151}
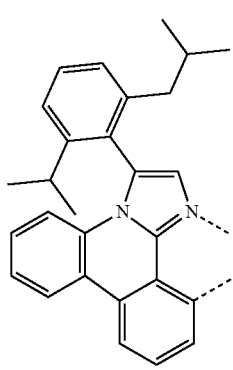
L_{B152}
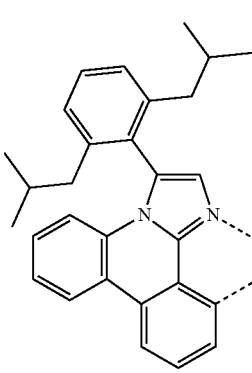
L_{B153}
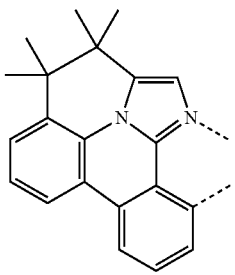
L_{B154}
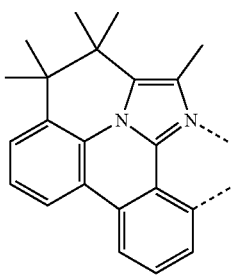
L_{B155}
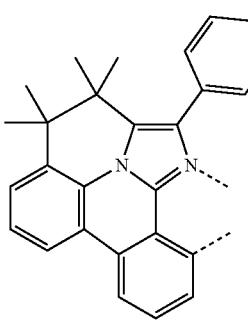
L_{B156}
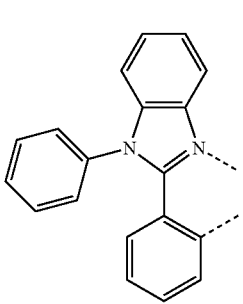
L_{B157}
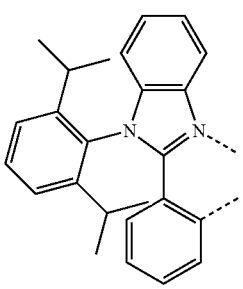
In some embodiments, the host material may include comprises aza-dibenzothiophene, di-aza-dibenzothiophene, or a combination thereof.

In some embodiments, the host material may include

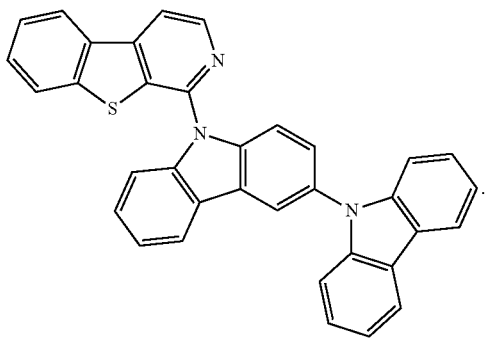 [SMILES: c1ccc2c(c1)sc1c(-n3c4ccccc4c4cc(-n5c6ccccc6c6ccccc65)ccc43)nccc12]

In some embodiments, the host material may include

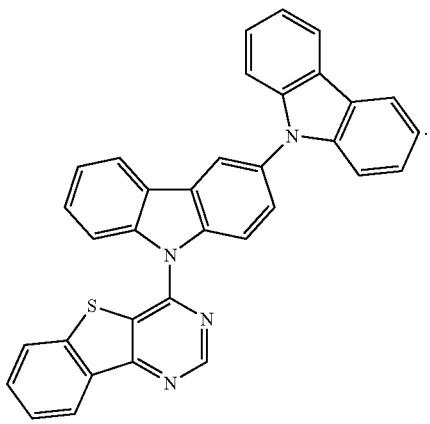 [SMILES: c1ccc2c(c1)sc1c(-n3c4ccccc4c4cc(-n5c6ccccc6c6ccccc65)ccc43)ncnc12]

In some embodiments, a consumer product or other electronic device may be provided that includes any of the materials, arrangements, and devices as previously disclosed.

Further information for the materials described herein, such as hosts and blue emissive materials having a first triplet state of at least 2.70 eV, is provided in U.S. Pat. Nos. 9,548,462, 7,491,823, 7,534,505, 9,493,698, 9,899,614, 9,502,656, and U.S. Patent Pub. No. US 2018/0182981, the disclosure of each of which is incorporated by reference in its entirety.

Combination With Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:
1. An organic light emitting device comprising:
   an anode;
   a cathode; and
   an organic layer disposed between the anode and the cathode, the organic layer comprising an organic host material and an emissive transition metal complex having the formula $M(L^1)_x(L^2)_y(L^3)_z$;
   wherein each $L^1$, $L^2$ and $L^3$ is different
   wherein x is 1 or 2;
   wherein y is 1 or 2;
   wherein z is 0, 1, or 2;
   wherein x+y+z is the oxidation state of the metal M;
   wherein M is selected from the group consisting of: Re, Rh, Ir, Pd, Pt, Os, and Au;
   wherein the host has a first triplet energy $T_{1H}$ and a first singlet energy $S_{1H}$;
   wherein the emissive transition metal complex has a first triplet energy $T_{1E}$;
   wherein $T_{1H}$ is at least 2.8 eV;
   wherein $T_{1E}$ is 2.70 eV or greater;
   wherein $T_{1H} > T_{1E}$; and
   wherein the absolute energy difference between $T_{1H}$ and $S_{1H}$ is not more than 0.3 eV;
   wherein $L^1$, $L^2$ and $L^3$ are each independently selected from the group consisting of:

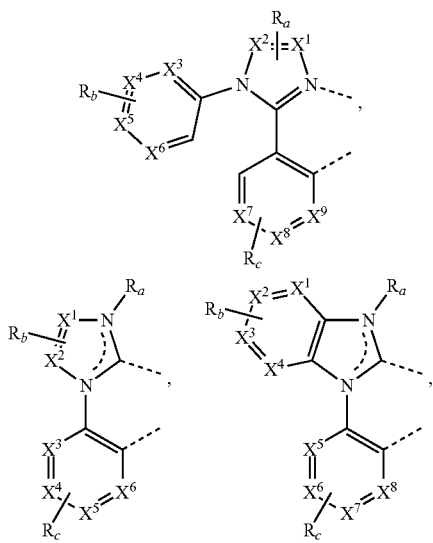
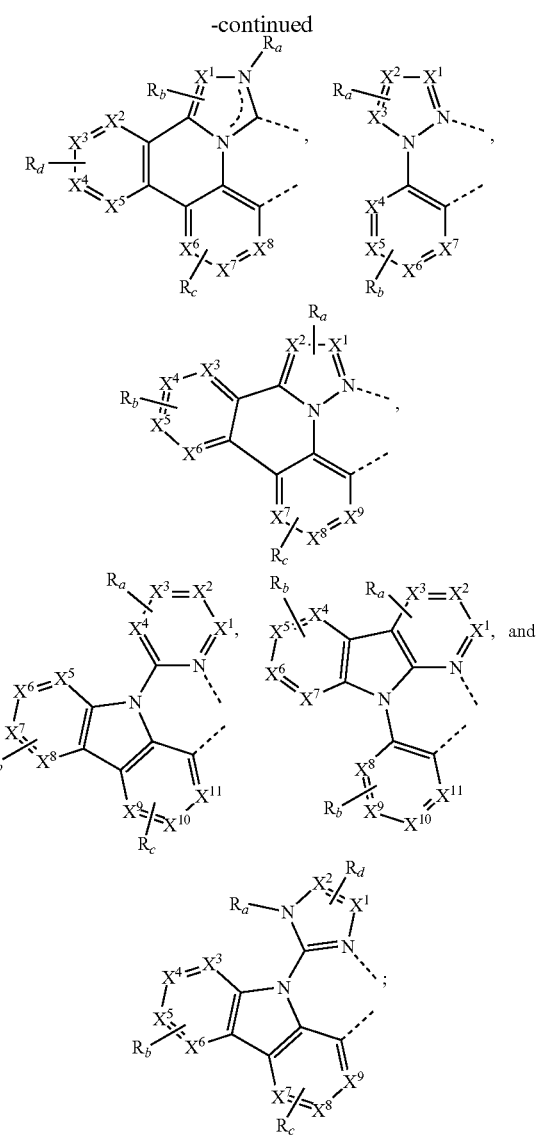

wherein each $X^1$ to $X^{11}$ are independently selected from the group consisting of carbon and nitrogen;
wherein X is selected from the group consisting of BR', NR', PR', O, S, Se, C=O, S=O, $SO_2$, CR'R", SiR'R", and GeR'R";
wherein R' and R" are optionally fused or joined to form a ring;
wherein each $R_a$, $R_b$, $R_c$, and $R_d$ may represent from mono substitution to the possible maximum number of substitution, or no substitution;
wherein R', R", $R_a$, $R_b$, $R_c$, and $R_d$ are each independently selected from the group consisting of hydrogen, deuterium, halogen, alkyl, cycloalkyl, heteroalkyl, heterocycloalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof; and
wherein any two $R_a$, $R_b$, $R_c$, and $R_d$ are optionally fused or joined to form a ring or form a multidentate ligand.
2. The organic light emitting device of claim 1, wherein the absolute energy difference between $T_{1H}$ and $S_{1H}$ is not more than 0.2 eV.

3. The organic light emitting device of claim 1, wherein the absolute energy difference between $T_{1H}$ and $S_{1H}$ is not more than 0.1 eV.

4. The organic light emitting device of claim 1, wherein each ligand is joined with one or more other ligands to form tetradentate, or hexadentate ligands.

5. The OLED of claim 1, wherein R', R", $R_a$, $R_b$, $R_c$, and $R_d$ are each independently selected from the group consisting of hydrogen, deuterium, fluorine, alkyl, cycloalkyl, alkoxy, aryloxy, amino, silyl, aryl, heteroaryl, sulfanyl, and combinations thereof.

6. The OLED of claim 1, wherein the compound has the formula selected from the group consisting of $Ir(L^1)(L^2)(L^3)$, and $Ir(L^1)_x(L^2)$;

wherein $L^1$, $L^2$ and $L^3$ are different and each independently selected from the group consisting of:

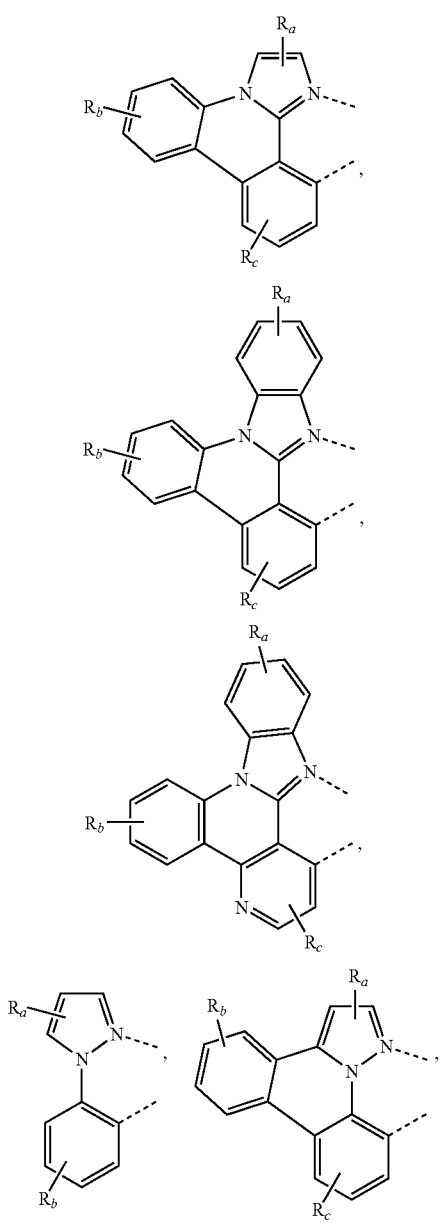

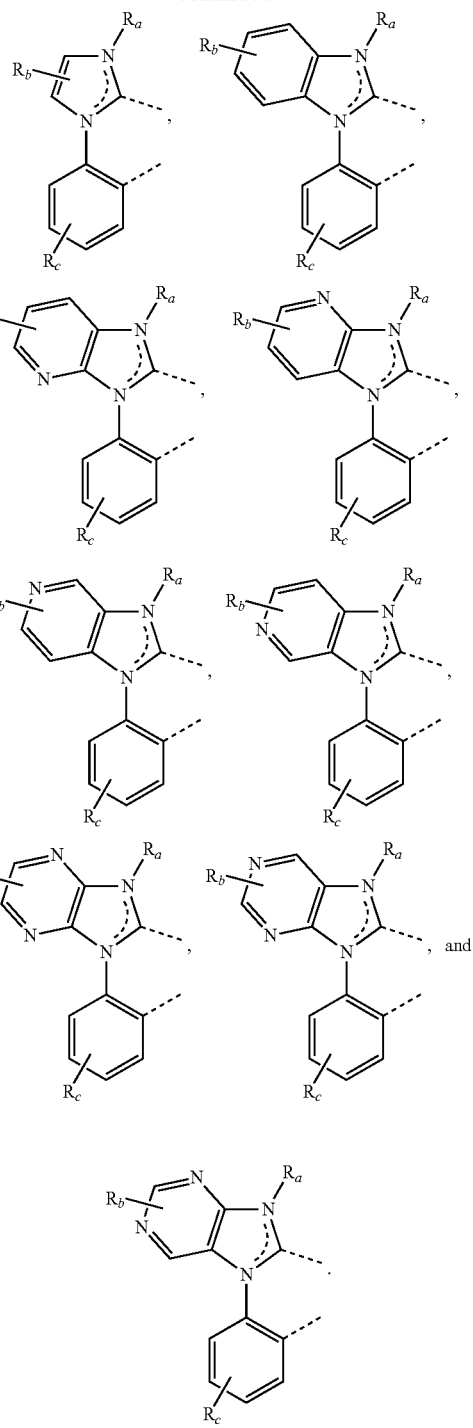

7. The OLED of claim 1, wherein the compound has the formula of $Pt(L^1)(L^2)$.

8. The OLED of claim 7, wherein $L^1$ is connected to $L^2$ to form a tetradentate ligand.

9. The OLED of claim 1, wherein the compound has the formula of $M(L^1)(L^2)$;

wherein M is Ir, Rh, Re, Ru, or Os, and wherein $L^1$ and $L^2$ are each a different tridentate ligand.

10. The OLED of claim 1, wherein L¹ is selected from the group consisting of:
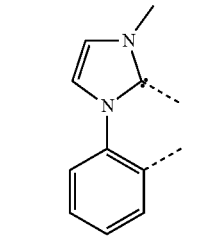
L_{B1}
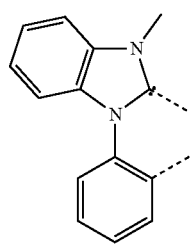
L_{B2}
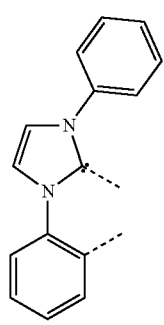
L_{B3}
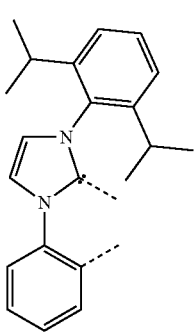
L_{B4}
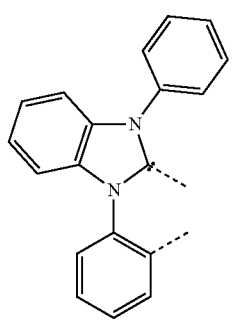
L_{B5}
-continued
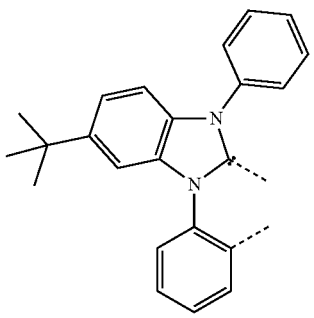
L_{B6}
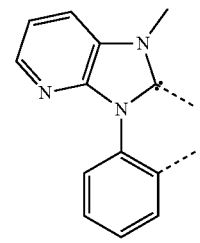
L_{B7}
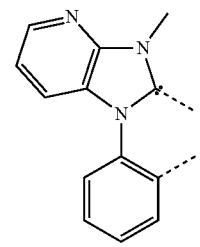
L_{B8}
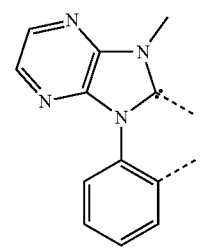
L_{B9}
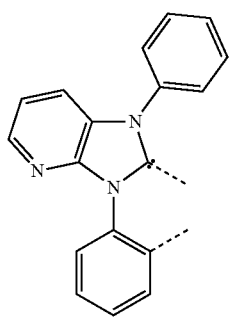
L_{B10}

L_{B11}
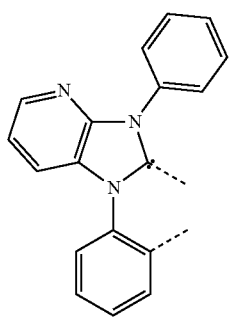
L_{B12}
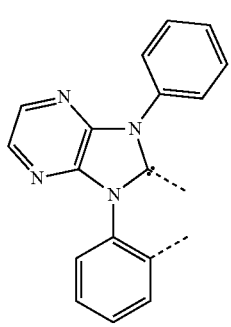
L_{B13}
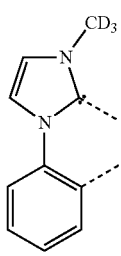
L_{B14}
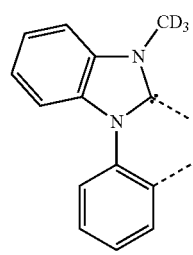
L_{B15}
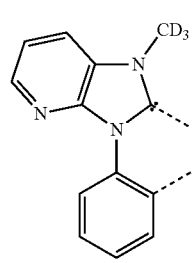
L_{B16}
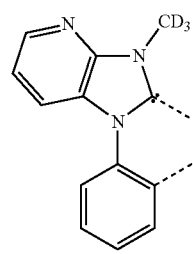
L_{B17}
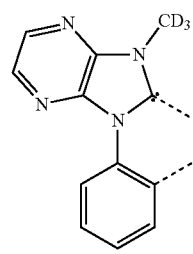
L_{B18}
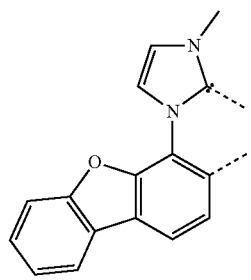
L_{B19}
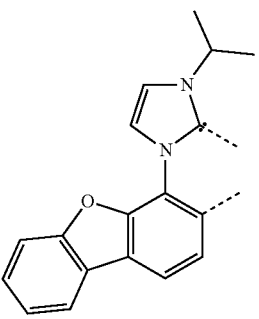
L_{B20}
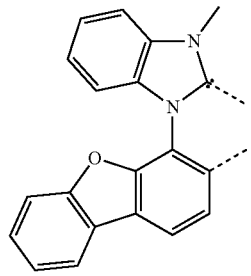

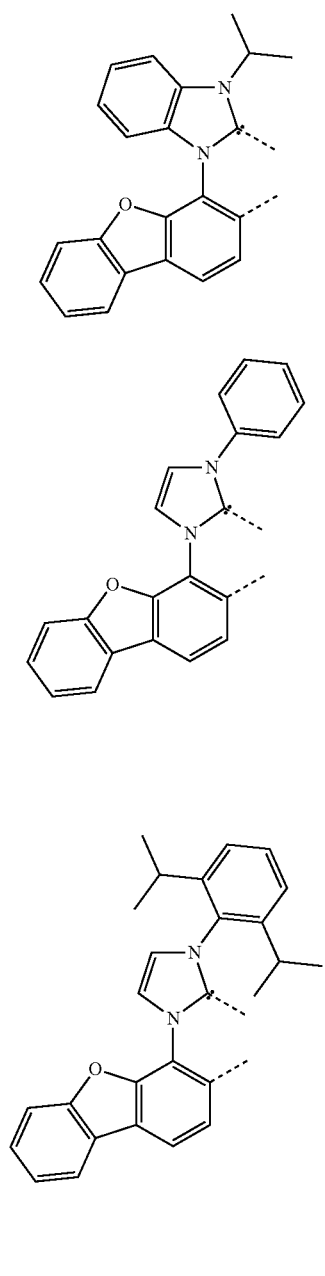
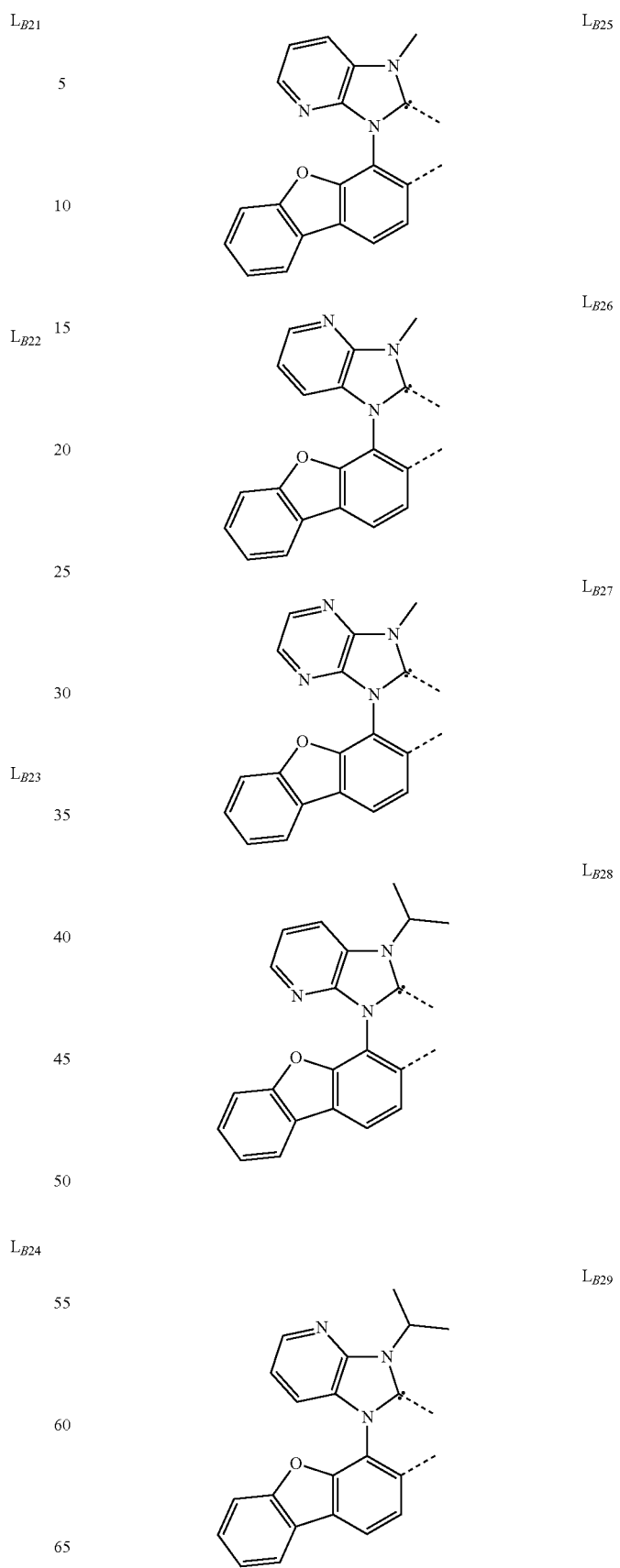

L_{B30}
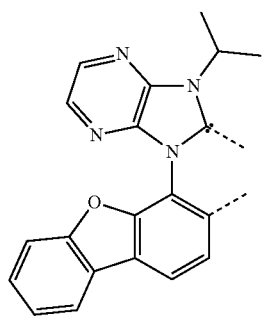
L_{B31}
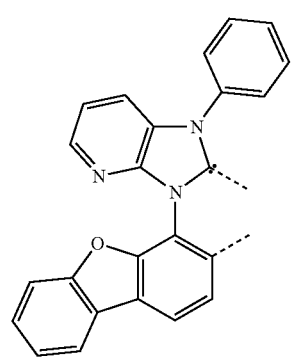
L_{B32}
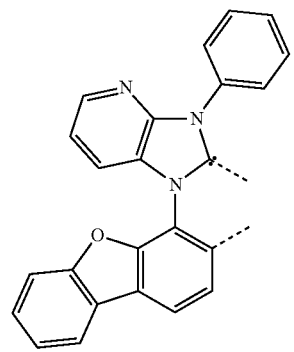
L_{B33}
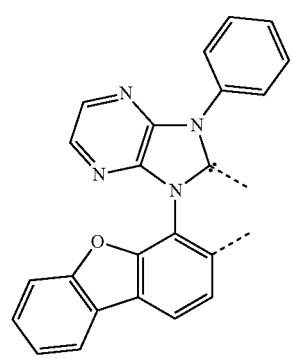
L_{B34}
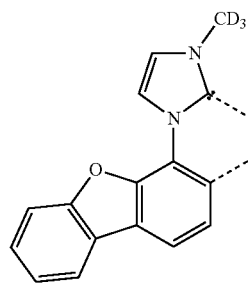
L_{B35}
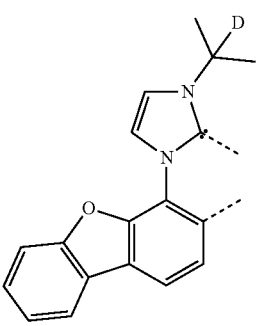
L_{B36}
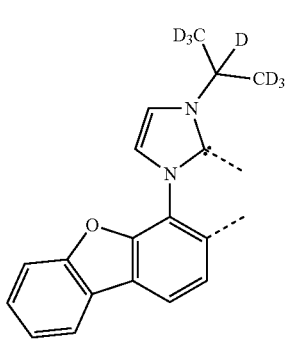
L_{B37}
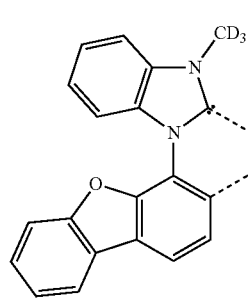
L_{B38}
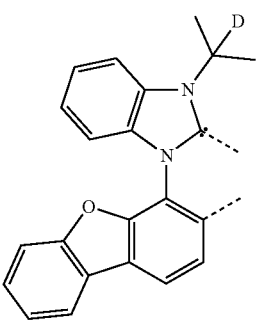

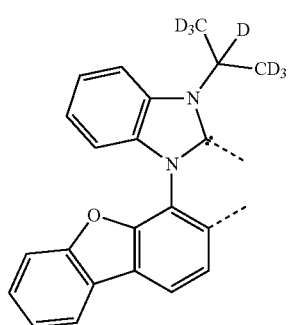 L_{B39}
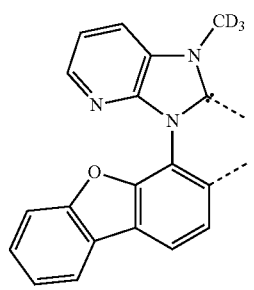 L_{B40}
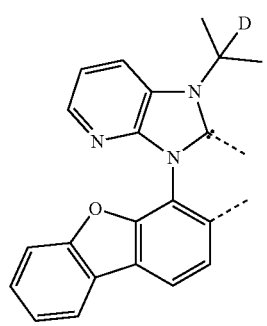 L_{B41}
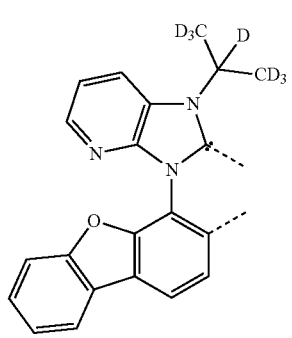 L_{B42}
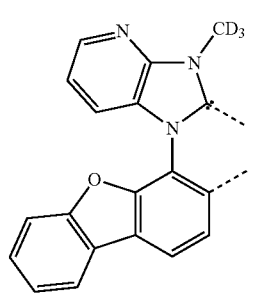 L_{B43}
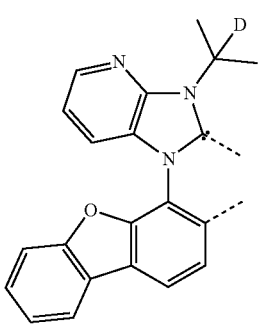 L_{B44}
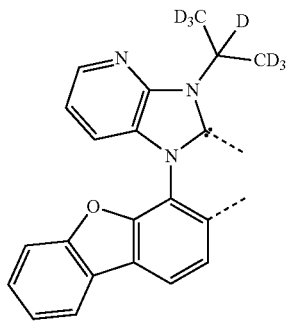 L_{B45}
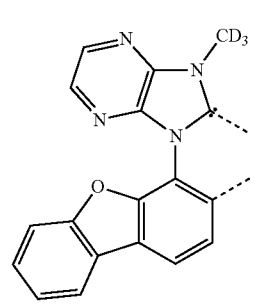 L_{B46}
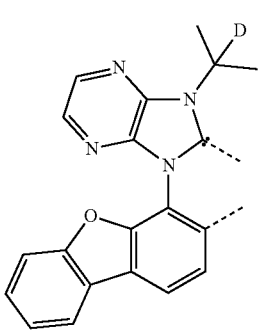 L_{B47}
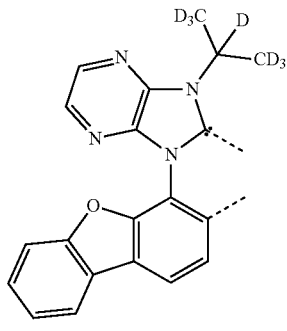 L_{B48}

-continued
L$_{B49}$
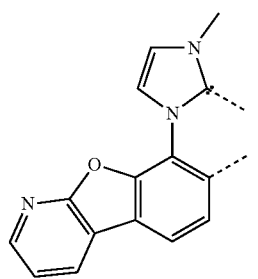
L$_{B50}$
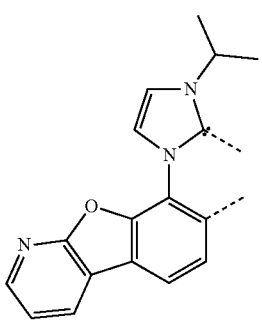
L$_{B51}$
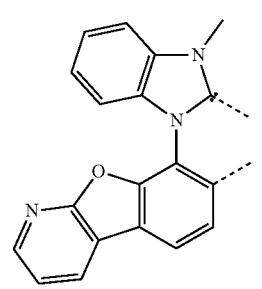
L$_{B52}$
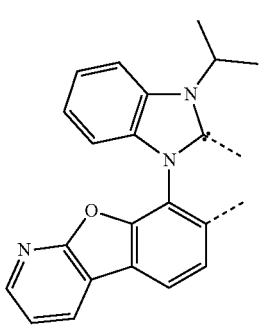
L$_{B53}$
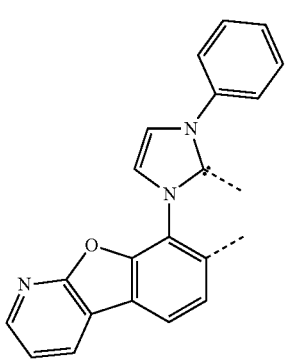
-continued
L$_{B54}$
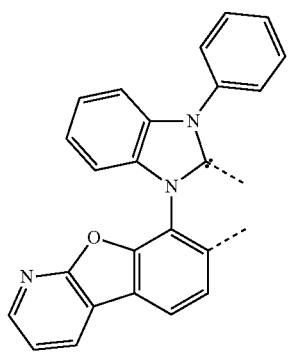
L$_{B55}$
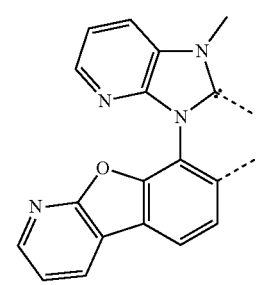
L$_{B56}$
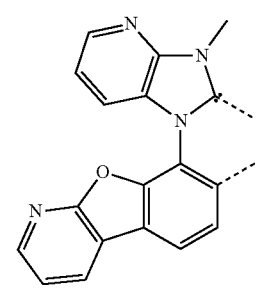
L$_{B57}$
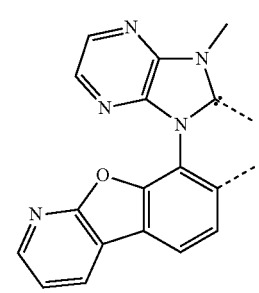
L$_{B58}$ L*B59* 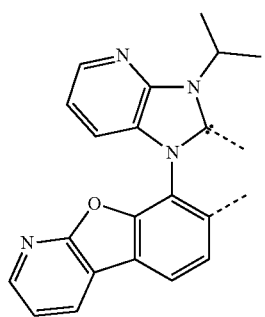
L*B60* 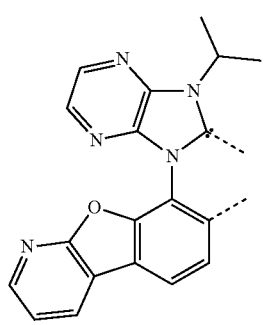
L*B61* 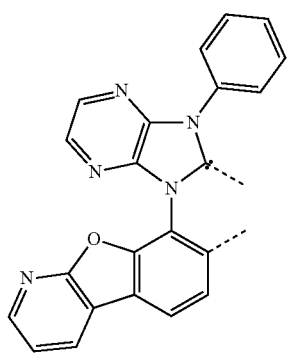
L*B62* 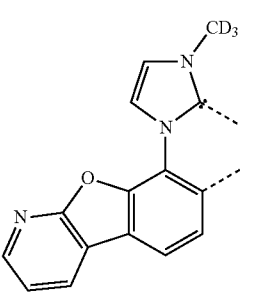
L*B63* 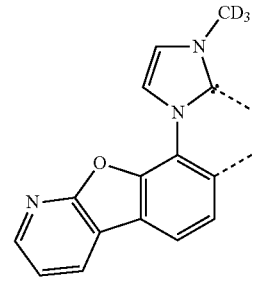
L*B64* 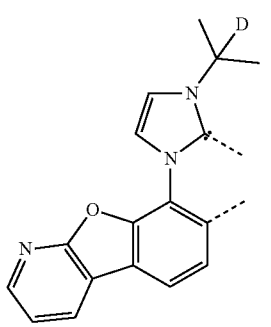
L*B65* 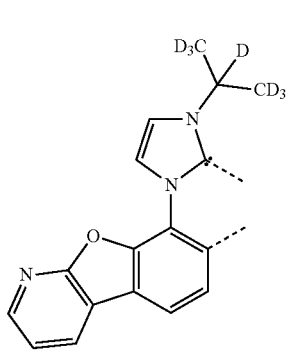
L*B66* 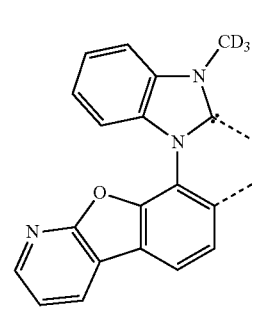
L*B67*

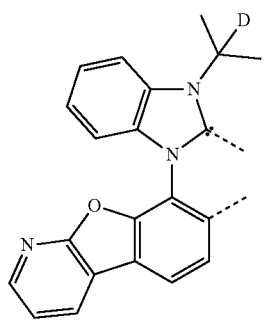 L_{B68}
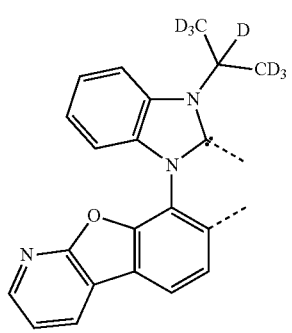 L_{B69}
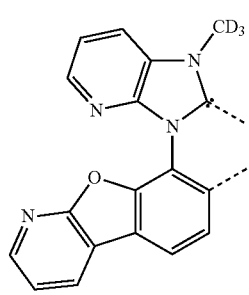 L_{B70}
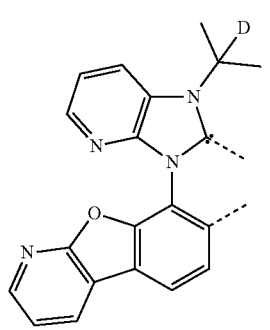 L_{B71}
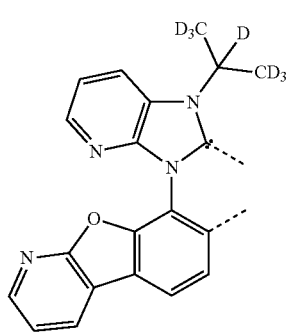 L_{B72}
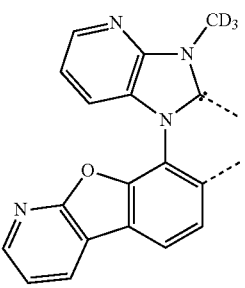 L_{B73}
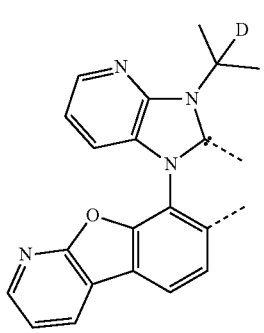 L_{B74}
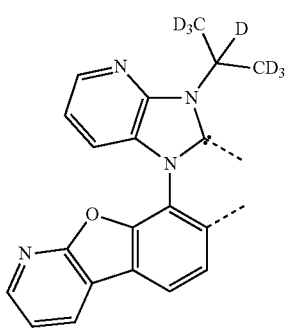 L_{B75}
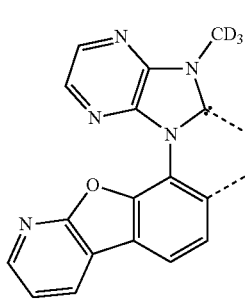 L_{B76}
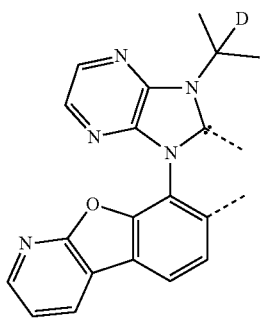 L_{B77}

| | |
|---|---|
| 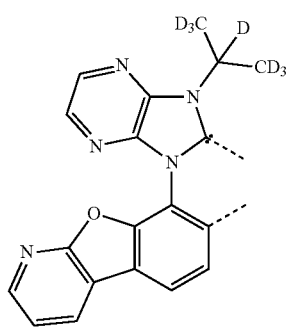 | L<sub>B78</sub> 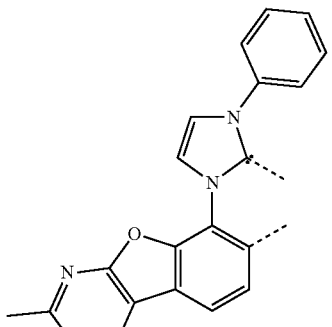 L<sub>B83</sub> |
| 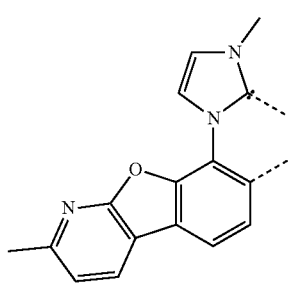 L<sub>B79</sub> | 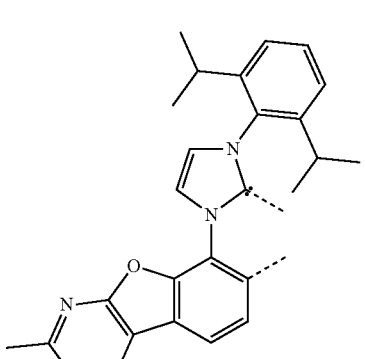 L<sub>B84</sub> |
| 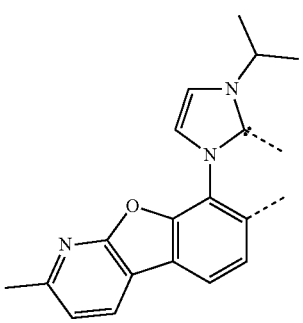 L<sub>B80</sub> | 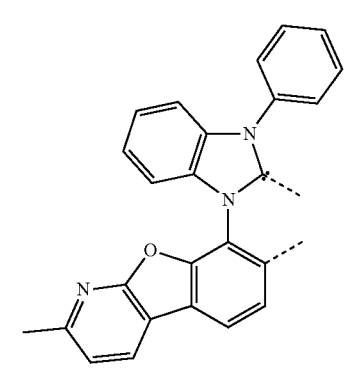 L<sub>B85</sub> |
| 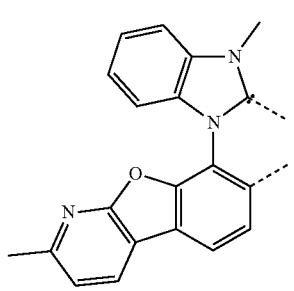 L<sub>B81</sub> | 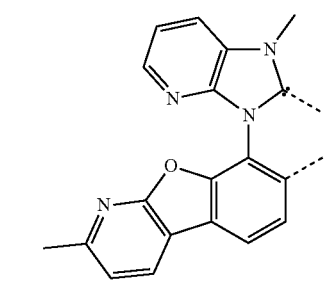 L<sub>B86</sub> |
| 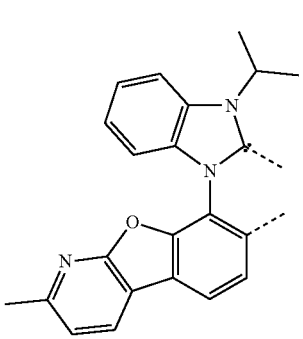 L<sub>B82</sub> | 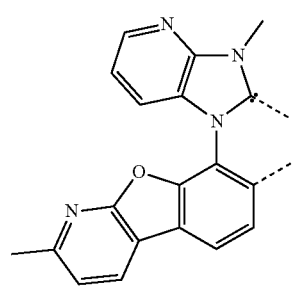 L<sub>B87</sub> |

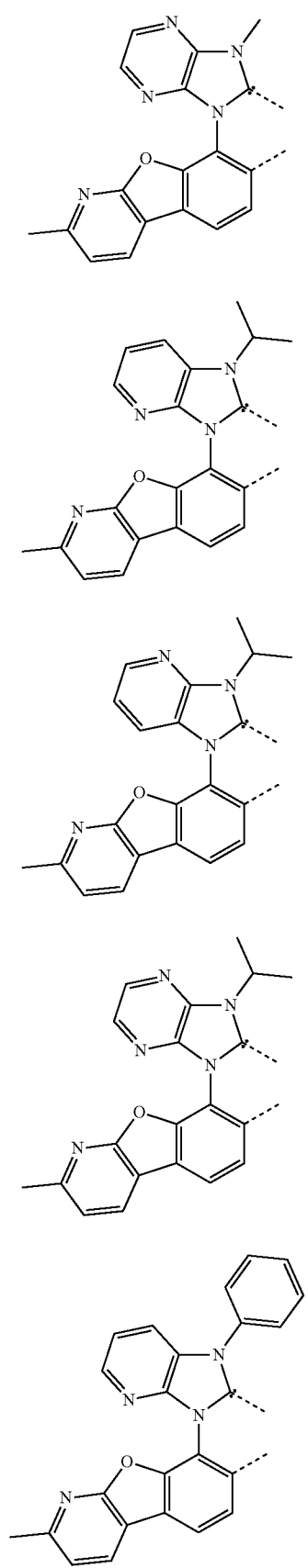
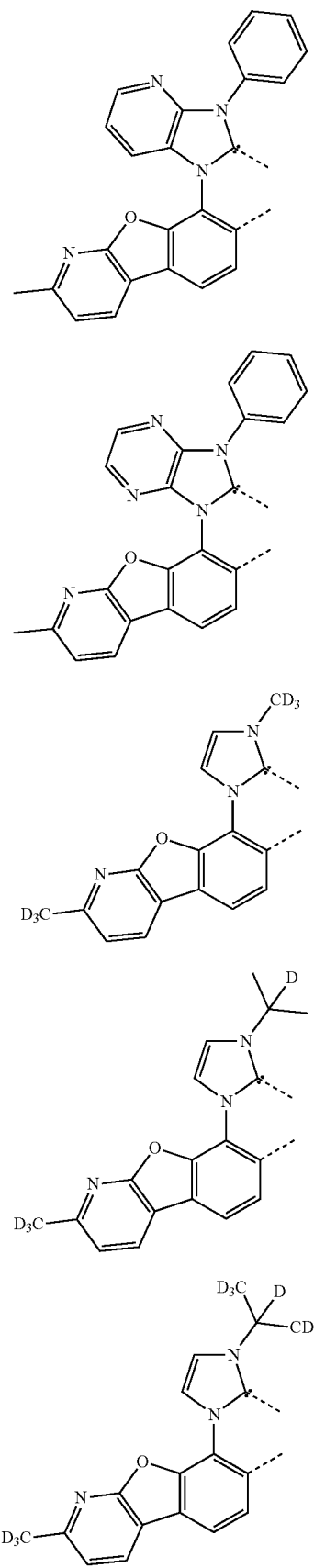

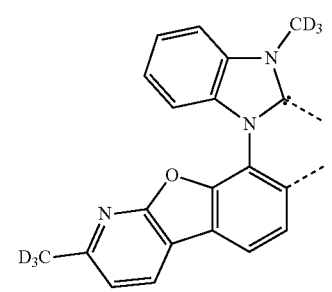 L_{B98}
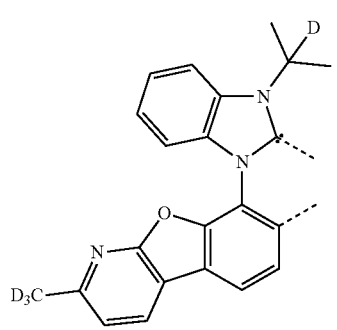 L_{B99}
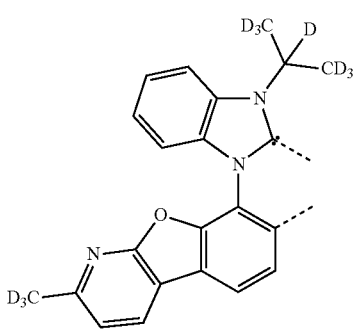 L_{B100}
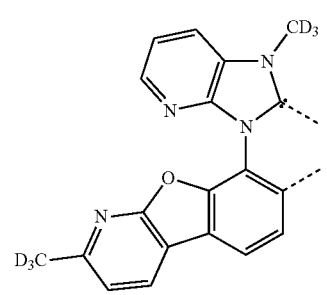 L_{B101}
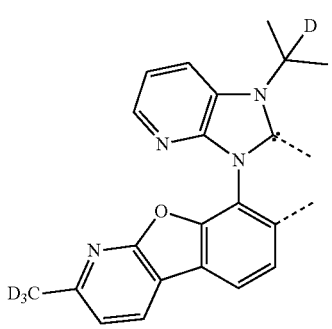 L_{B102}
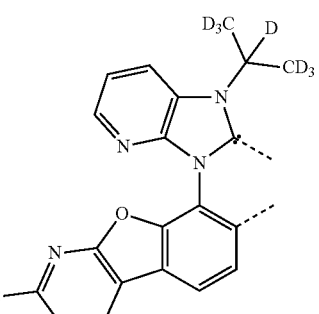 L_{B103}
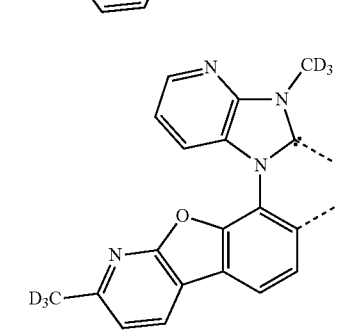 L_{B104}
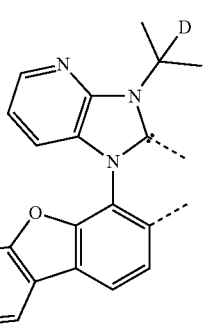 L_{B105}
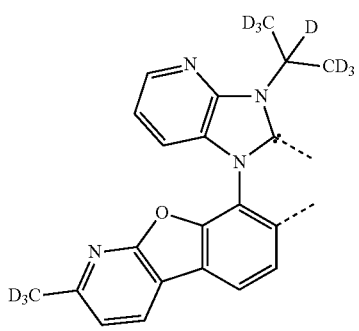 L_{B106}
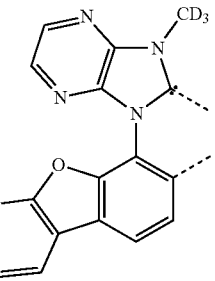 L_{B107}

L<sub>B108</sub>
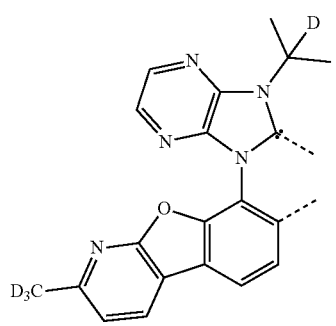
L<sub>B109</sub>
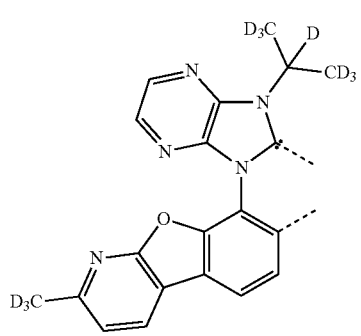
L<sub>B110</sub>
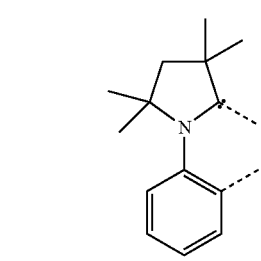
L<sub>B111</sub>
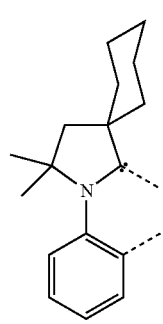
L<sub>B112</sub>
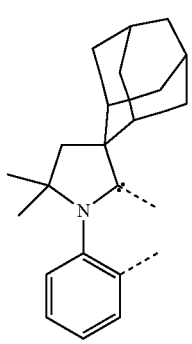
L<sub>B113</sub>
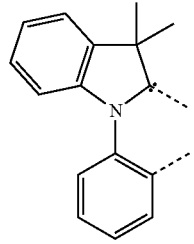
L<sub>B114</sub>
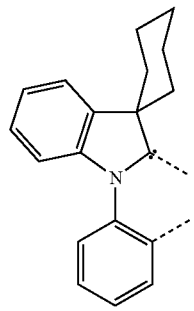
L<sub>B115</sub>
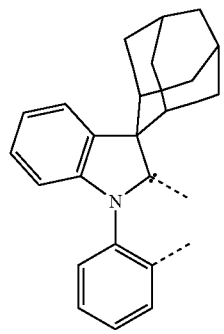
L<sub>B116</sub>
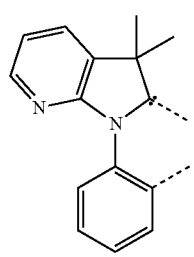
L<sub>B117</sub>
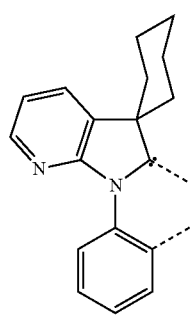

-continued
L<sub>B118</sub>
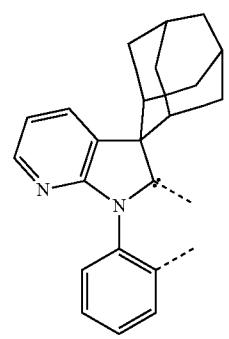
L<sub>B119</sub>
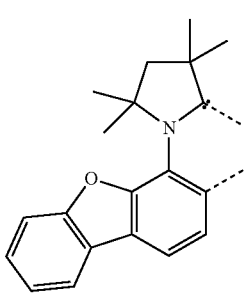
L<sub>B120</sub>
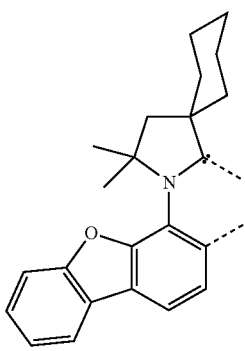
L<sub>B121</sub>
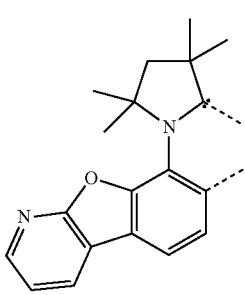
L<sub>B122</sub>
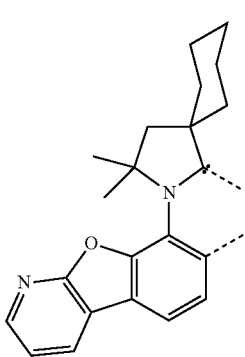
-continued
L<sub>B123</sub>
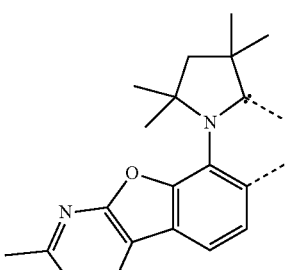
L<sub>B124</sub>
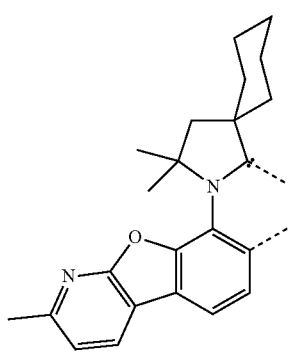
L<sub>B125</sub>
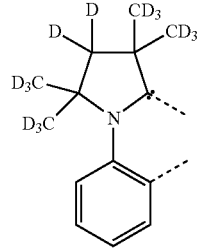
L<sub>B126</sub>
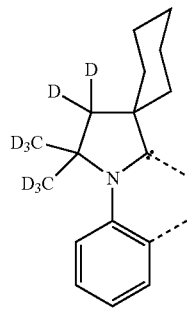
L<sub>B127</sub>
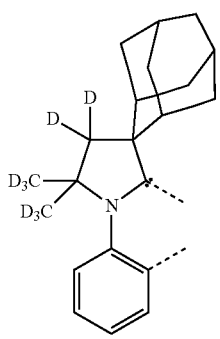

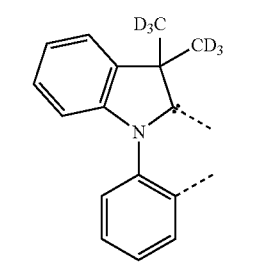 L_{B128}
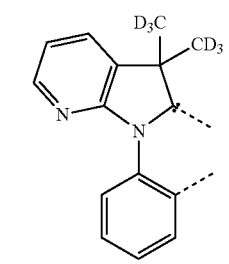 L_{B129}
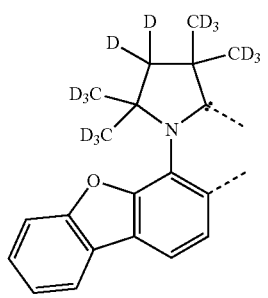 L_{B130}
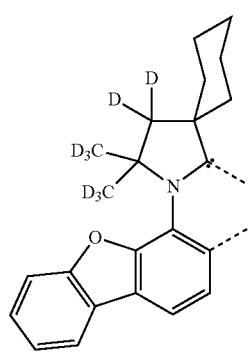 L_{B131}
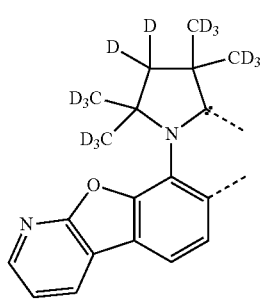 L_{B132}
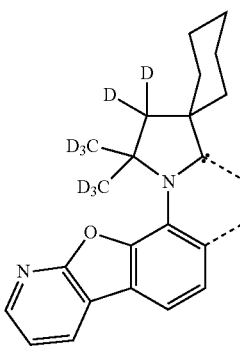 L_{B133}
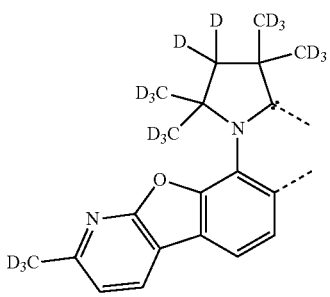 L_{B134}
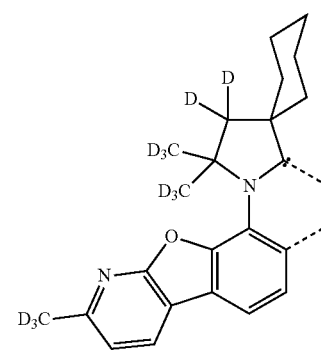 L_{B135}
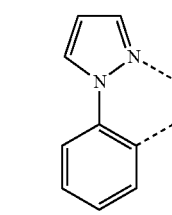 L_{B136}
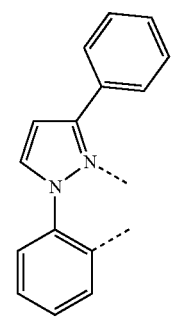 L_{B137}

L_{B138}
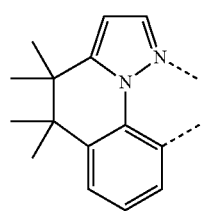
L_{B139}
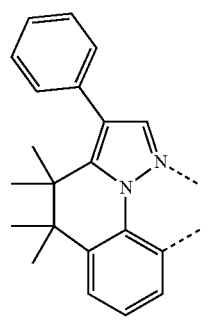
L_{B140}
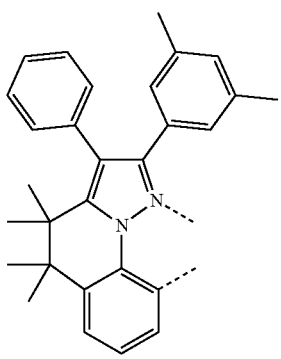
L_{B141}
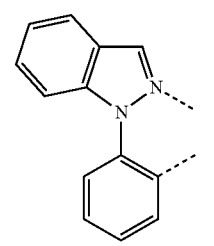
L_{B142}
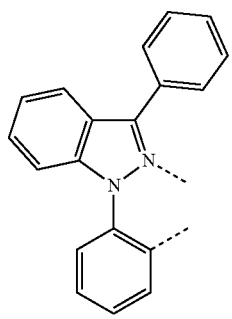
L_{B150}
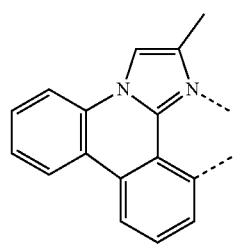
L_{B151}
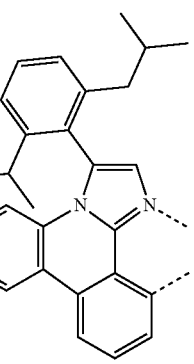
L_{B152}
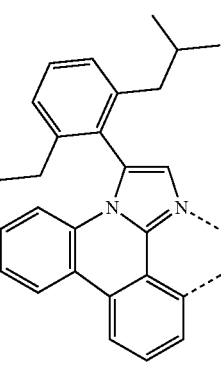
L_{B153}
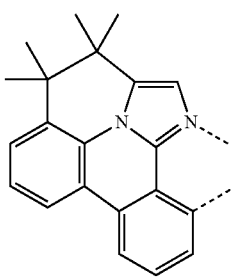
L_{B154}
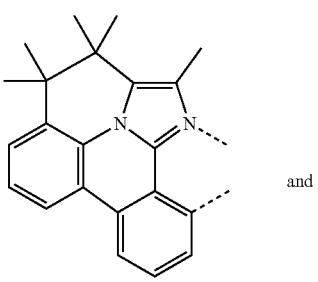
and -continued

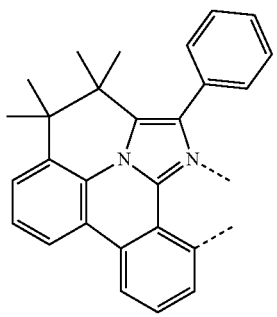

L<sub>B155</sub>

11. The organic light emitting device of claim 1, wherein the host material comprises aza-dibenzothiophene, di-aza-dibenzothiophene, or a combination thereof.

12. The organic light emitting device of claim 1, wherein the host material comprises:

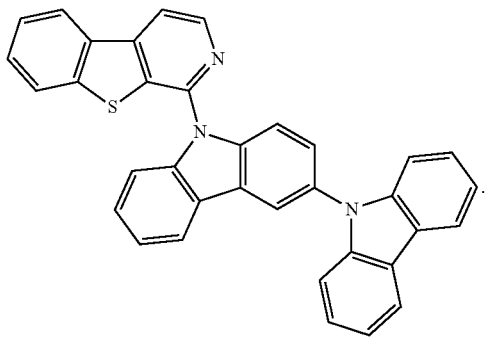 [SMILES: c1ccc2c(c1)sc1c(-n3c4ccccc4c4cc(-n5c6ccccc6c6ccccc65)ccc43)nccc12]

13. The organic light emitting device of claim 1, wherein the host material comprises:

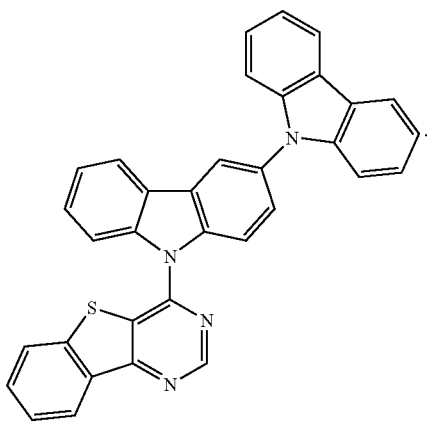 [SMILES: c1ccc2c(c1)sc1c(-n3c4ccccc4c4cc(-n5c6ccccc6c6ccccc65)ccc43)ncnc12]

14. A consumer product comprising an organic light-emitting device (OLED) comprising:
an anode;
a cathode; and
an organic layer disposed between the anode and the cathode, the organic layer comprising an organic host material and an emissive transition metal complex having the formula $M(L^1)_x(L^2)_y(L^3)_z$;

wherein each $L^1$, $L^2$ and $L^3$ is different
wherein x is 1 or 2;
wherein y is 1 or 2;
wherein z is 0, 1, or 2;
wherein x+y+z is the oxidation state of the metal M;
wherein M is selected from the group consisting of: Re, Rh, Ir, Pd, Pt, Os, and Au;
wherein the host has a first triplet energy LH and a first singlet energy $S_{1H}$;
wherein the emissive transition metal complex has a first triplet energy $T_{1E}$;
wherein $T_{1H}$ is at least 2.8 eV;
wherein $T_{1E}$ is 2.70 eV or greater;
wherein $T_{1H} > T_{1E}$; and
wherein the absolute energy difference between $T_{1H}$ and $S_{1H}$ is not more than 0.3 eV;
wherein $L^1$, $L^2$ and $L^3$ are each independently selected from the group consisting of:

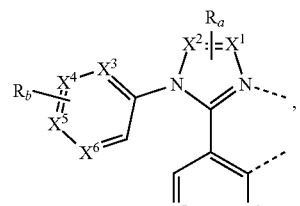

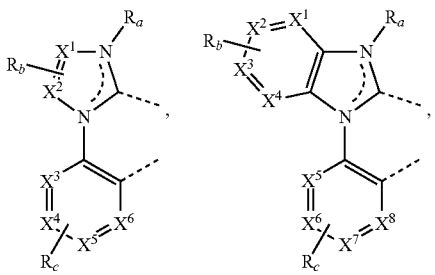

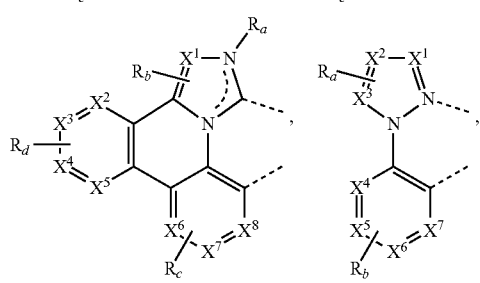

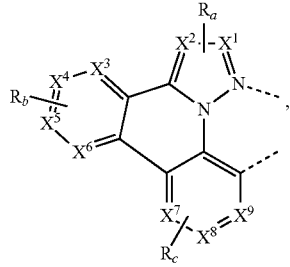

-continued

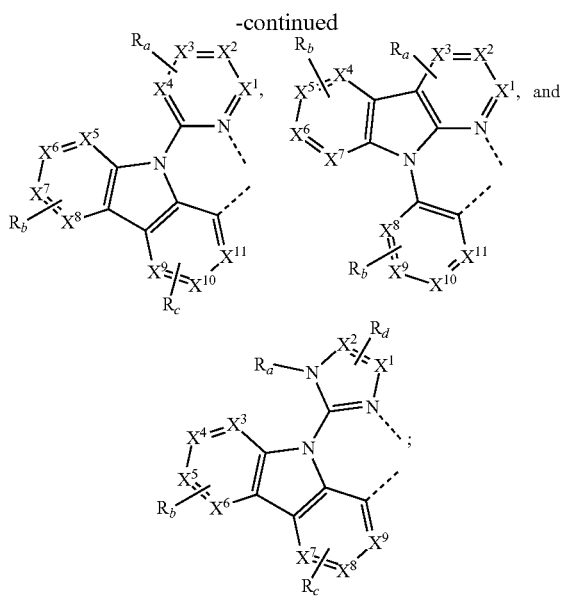

wherein each $X^1$ to $X^{11}$ are independently selected from the group consisting of carbon and nitrogen;

wherein X is selected from the group consisting of BR', NR', PR', O, S, Se, C=O, S=O, $SO_2$, CR'R", SiR'R", and GeR'R";

wherein R' and R" are optionally fused or joined to form a ring;

wherein each $R_a$, $R_b$, $R_c$, and $R_d$ may represent from mono substitution to the possible maximum number of substitution, or no substitution;

wherein R', R", $R_a$, $R_b$, $R_c$, and $R_d$ are each independently selected from the group consisting of hydrogen, deuterium, halogen, alkyl, cycloalkyl, heteroalkyl, heterocycloalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof; and wherein any two $R_a$, $R_b$, $R_c$, and $R_d$ are optionally fused or joined to form a ring or form a multidentate ligand.

15. The consumer product of claim 14, wherein the consumer product is selected from the group consisting of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a microdisplay that is less than 2 inches diagonal, a 3-D display, a virtual reality or augmented reality display, a vehicle, a video wall comprising multiple displays tiled together, a theater or stadium screen, a light therapy device, and a sign.

* * * * *